(12) United States Patent
Nakajima et al.

(10) Patent No.: US 7,973,266 B2
(45) Date of Patent: Jul. 5, 2011

(54) HEAT TREATMENT APPARATUS WHICH EMITS FLASH OF LIGHT

(75) Inventors: Toshihiro Nakajima, Kyoto (JP); Jun Watanabe, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 730 days.

(21) Appl. No.: 11/938,876

(22) Filed: Nov. 13, 2007

(65) Prior Publication Data

US 2008/0116196 A1    May 22, 2008

(30) Foreign Application Priority Data

Nov. 22, 2006   (JP) ................................ 2006-315471

(51) Int. Cl.
*H05B 3/06* (2006.01)
*A21B 2/00* (2006.01)

(52) U.S. Cl. ..... 219/521; 219/390; 219/388; 219/121.6; 219/405; 219/411; 392/416; 392/418; 392/423; 392/424; 118/724; 118/725; 118/50.1; 118/729

(58) Field of Classification Search .................. 219/521, 219/390, 388, 121.6, 405, 411; 392/416, 392/418, 423, 424; 118/724, 725, 50.1, 729
See application file for complete search history.

(56) References Cited

U.S. PATENT DOCUMENTS

| 6,936,797 B2 | 8/2005 | Hosokawa | 219/405 |
| 6,998,580 B2 * | 2/2006 | Kusuda et al. | 219/411 |
| 2003/0183168 A1 | 10/2003 | Kusuda et al. | 118/641 |
| 2003/0235972 A1 | 12/2003 | Hosokawa | 438/530 |

FOREIGN PATENT DOCUMENTS

| JP | 7-37833 | | 2/1995 |
| JP | 08-060371 | | 3/1996 |
| JP | 8-60371 | * | 3/1996 |
| JP | 10-233370 | | 9/1998 |
| JP | 2004-55821 | | 2/2004 |
| JP | 2004-88052 | | 3/2004 |

* cited by examiner

*Primary Examiner* — Shawntina Fuqua
(74) *Attorney, Agent, or Firm* — Ostrolenk Faber LLP

(57) ABSTRACT

In a heat treatment apparatus, a reflector is provided to cover a plurality of flash lamps arranged in an array for emitting a flash of light, and a cooling box is provided over the reflector. The cooling box has a buffer space incorporated therein, and a plurality of jet openings in communication with the buffer space are formed through a bottom surface of the cooling box and the reflector. The plurality of jet openings are positioned just over gaps between the plurality of flash lamps in the lamp array. Nitrogen gas ejected from the plurality of jet openings passes through the gaps between adjacent ones of the flash lamps in the lamp array, and is then blown against a lamp light radiation window. The flash lamps are effectively cooled down by the direct cooling using the nitrogen gas and the decrease in temperature of the lamp light radiation window.

7 Claims, 11 Drawing Sheets

FIG. 1
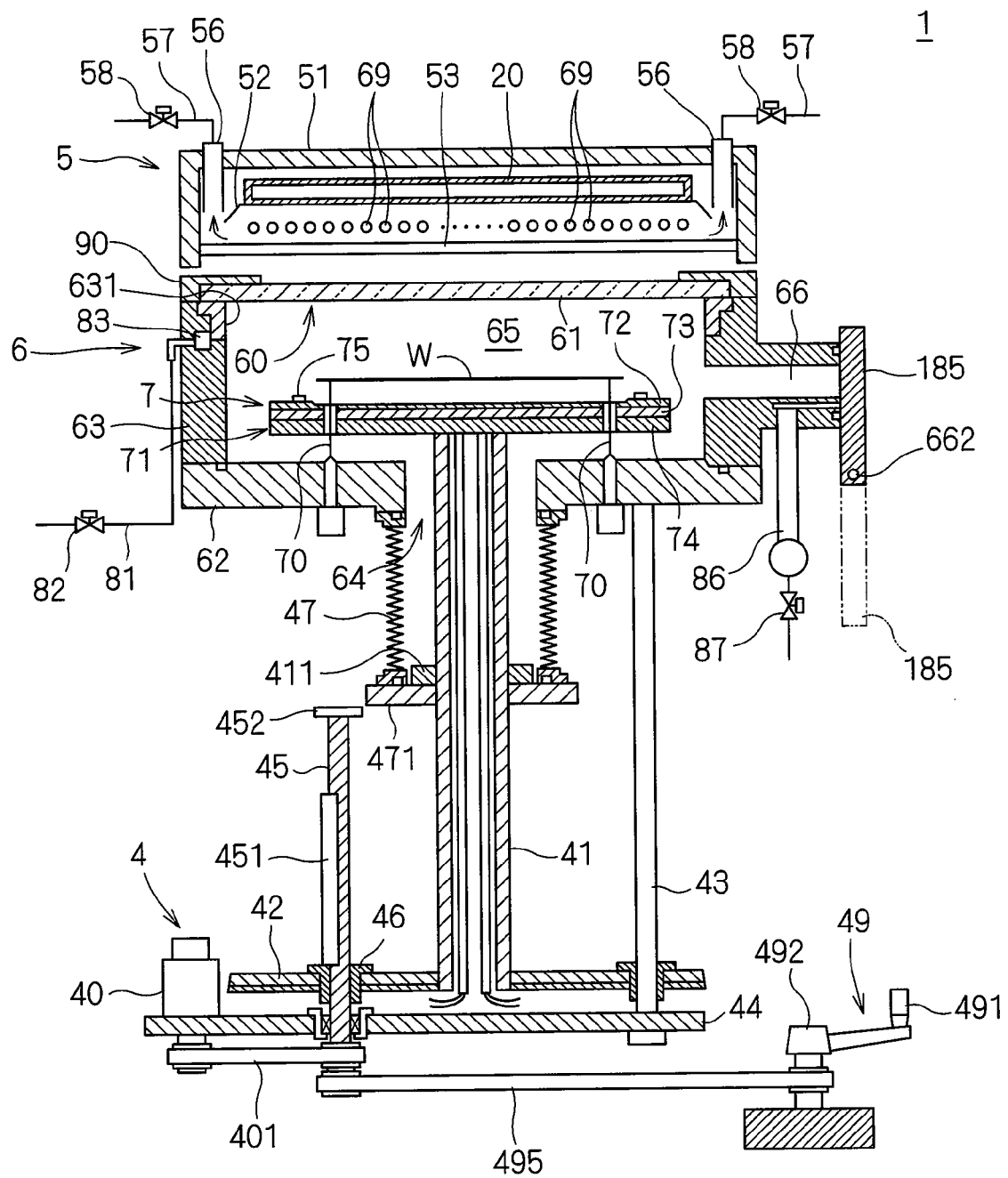
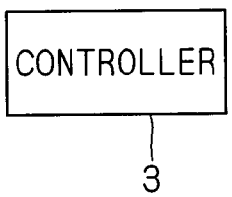

F I G . 2
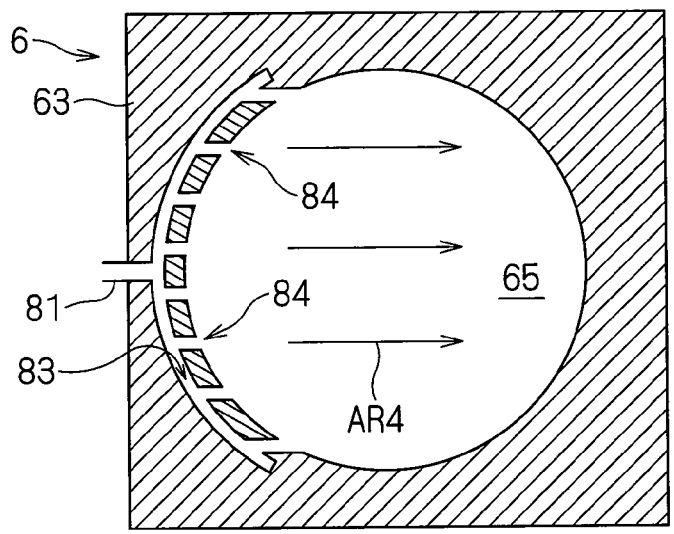
F I G . 3
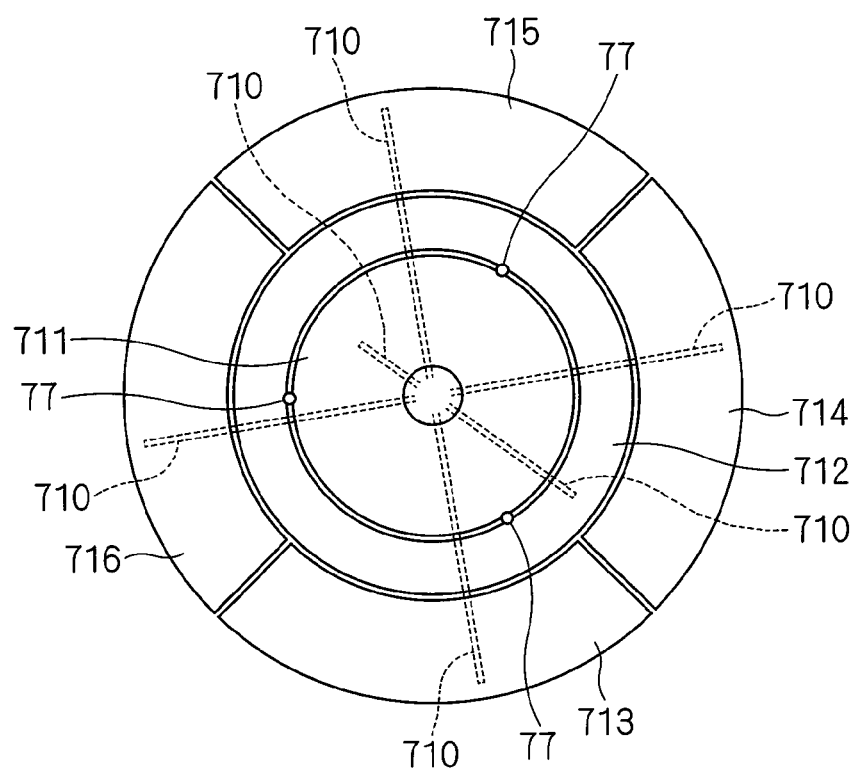

F I G . 1 0
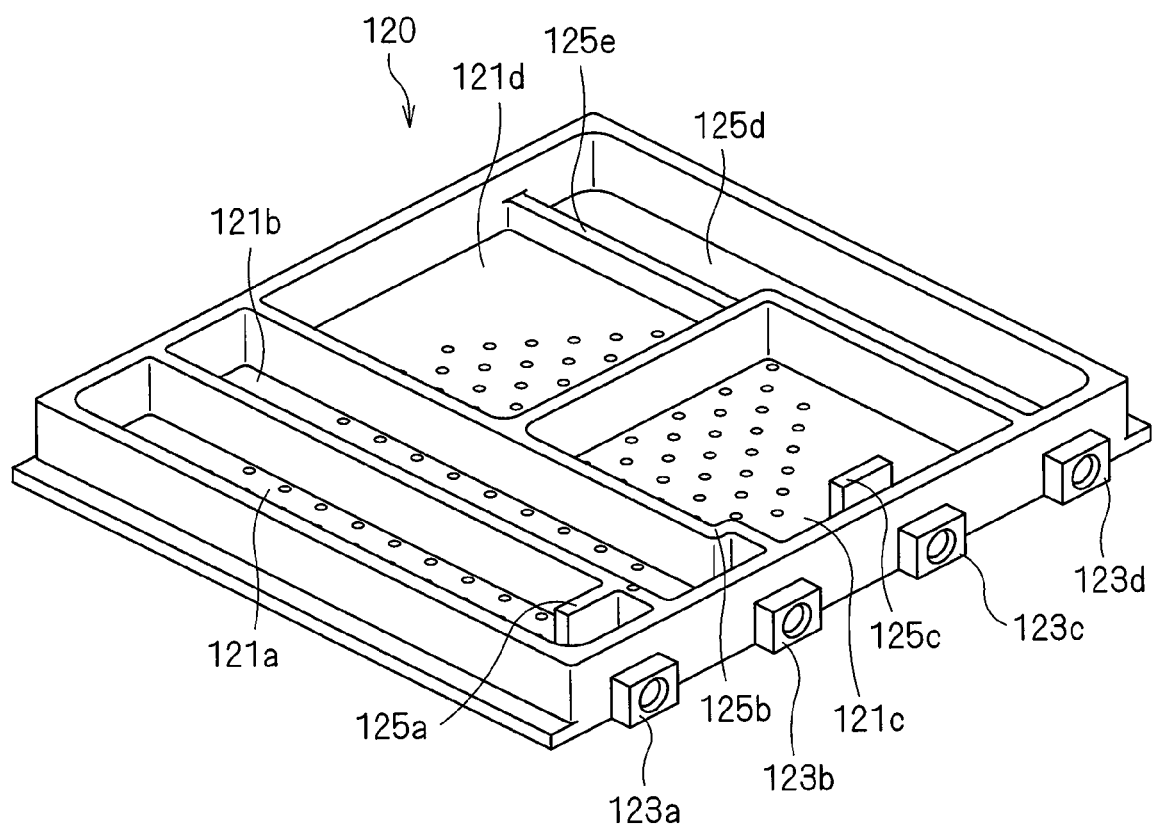

HEAT TREATMENT APPARATUS WHICH EMITS FLASH OF LIGHT

BACKGROUND OF THE INVENTION

1. Field of the Invention

The present invention relates to a heat treatment apparatus which emits a flash of light to expose a substrate including a semiconductor wafer, a glass substrate for a liquid crystal display device and the like to the flash of light, thereby heating the substrate.

2. Description of the Background Art

Conventionally, a lamp annealer employing a halogen lamp has been typically used in the step of activating ions in a semiconductor wafer after ion implantation. Such a lamp annealer carries out the activation of ions in the semiconductor wafer by heating (or annealing) the semiconductor wafer to a temperature of, for example, about 1000° C. to about 1100° C. Such a heat treatment apparatus utilizes the energy of light emitted from the halogen lamp to raise the temperature of a substrate at a rate of about hundreds of degrees per second.

In recent years, with the increasing degree of integration of semiconductor devices, it has been desired to provide a shallower junction as the gate length decreases. It has turned out, however, that even the execution of the process of activating ions in a semiconductor wafer by the use of the above-mentioned lamp annealer which raises the temperature of the semiconductor wafer at a rate of about hundreds of degrees per second produces a phenomenon in which the ions of boron, phosphorus and the like implanted in the semiconductor wafer are diffused deeply by heat. The occurrence of such a phenomenon causes the depth of the junction to exceed a required level, giving rise to an apprehension about a hindrance to good device formation.

To solve the problem, there has been proposed a technique for exposing the surface of a semiconductor wafer to a flash of light by using a xenon flash lamp to raise the temperature of only the surface of the semiconductor wafer implanted with ions in an extremely short time (several milliseconds or less). This technique is disclosed, for example, in U.S. Pat. Nos. 6,998,580 and 6,936,797. The xenon flash lamp has a spectral distribution of radiation ranging from ultraviolet to near-infrared regions. The wavelength of light emitted from the xenon flash lamp is shorter than that of light emitted from the conventional halogen lamp, and approximately coincides with a basic absorption band of a silicon semiconductor wafer. It is therefore possible to rapidly raise the temperature of the semiconductor wafer, with a small amount of light transmitted through the semiconductor wafer, when the semiconductor wafer is exposed to a flash of light emitted from the xenon flash lamp. Also, it has turned out that a flash of light emitted in an extremely short time of several milliseconds or less can achieve a selective temperature rise only near the surface of the semiconductor wafer. Therefore, the temperature rise in an extremely short time by using the xenon flash lamp allows the execution of only the ion activation without deeply diffusing the ions.

In the heat treatment apparatus which performs flash heating as described above, air is supplied into and exhausted from a lamp house including a xenon flash lamp provided therein for the purpose of cooling down the xenon flash lamp. Thus, the heat within the lamp house is exhausted, and the xenon flash lamp itself is cooled down by the air.

Many heat treatment apparatuses which perform flash heating are provided with a hot plate for preheating a semiconductor wafer before exposing the semiconductor wafer to a flash of light. An attempt to heat the surface of the semiconductor wafer up to 1000° C. or higher only by exposing the semiconductor wafer to the flash of light requires the emission of a flash of light having an extremely large amount of energy. This causes the rapid heating of only the wafer surface to give rise to an apprehension about a crack in the semiconductor wafer. To prevent this, the hot plate is used to preheat the semiconductor wafer placed thereon up to about 500° C., and thereafter a flash of light is emitted from the xenon flash lamp to cause the temperature of the semiconductor wafer to reach a predetermined annealing temperature.

However, infrared radiation of a relatively long wavelength depending on the temperature of the hot plate emanates from the hot plate. The discharge tube (made of quartz) of the xenon flash lamp is externally heated by the radiant heat from the hot plate. If the xenon flash lamp is heated by the radiant heat from the hot plate at a relatively high temperature of 500° C. or higher, the xenon flash lamp is not sufficiently cooled down only by the above-mentioned supply and exhaust of air, but there arise problems such that the color change of the discharge tube reduces the lifetime of the xenon flash lamp and such that the deterioration of the xenon flash lamp proceeds rapidly to result in the rupture of the xenon flash lamp in the worst case. In the conventional techniques, the upper limit of the preheating temperature attained by the hot plate is hence restricted, and the treating conditions of the annealing process of the semiconductor wafer are also inevitably limited.

A lamp house having a xenon flash lamp provided therein includes a quartz plate which allows a flash of light emitted from the xenon flash lamp to pass therethrough and which serves as a lamp light radiation window. The lamp light radiation window is also heated by far infrared radiation of a long wavelength emanating from the hot plate. If air is supplied into and exhausted from the lamp house for the purpose of cooling down the xenon flash lamp, the lamp light radiation window is also cooled down, and the distribution of temperature thereof becomes nonuniform. The infrared radiation of a long wavelength emanates also from the heated lamp light radiation window to influence the temperature of the semiconductor wafer W. The nonuniformity of the temperature distribution across the lamp light radiation window might cause variations in the temperature distribution across a semiconductor wafer to be treated.

SUMMARY OF THE INVENTION

The present invention is intended for a heat treatment apparatus for exposing a substrate to a flash of light to heat the substrate.

According to the present invention, the heat treatment apparatus comprises: a chamber for receiving a substrate therein, the chamber including a holding part for holding the substrate, the holding part including a preheating mechanism for preheating the substrate held by the holding part before the substrate is exposed to a flash of light, and a chamber window for allowing a flash of light to pass therethrough into the holding part; and a lamp house for emitting a flash of light, the lamp house including a light source including a plurality of flash lamps arranged in an array and each having a rodlike discharge tube for directing a flash of light from the discharge tubes toward the substrate held by the holding part within the chamber, a radiation window provided in opposed relation to the chamber window for allowing a flash of light emitted from the light source to pass therethrough toward the chamber, and a gas ejection part for causing a gas to pass through gaps between the plurality of flash lamps arranged in the array and to be blown against the radiation window.

The gas passing through the gaps between the plurality of flash lamps arranged in the array is blown against the radiation window. Thus, not only the direct cooling of the flash lamps by using the gas but also the decrease in temperature of the radiation window suppresses a lamp temperature rise resulting from radiation from the radiation window, to thereby accomplish the effective cooling of the flash lamps.

Preferably, the gas ejection part includes a buffer space divided into a plurality of compartments, and a plurality of jet openings extending through wall surfaces of the plurality of compartments toward the gaps between the plurality of flash lamps. The heat treatment apparatus further comprises: a gas supply element for individually supplying a gas to the plurality of compartments of the buffer space; and a flow rate adjustment element for individually adjusting the flow rate of the gas supplied from the gas supply element to each of the plurality of compartments.

The individual adjustment of the flow rate of the gas supplied to each of the plurality of compartments of the buffer space allows the cooling of the flash lamps with higher accuracy.

More preferably, the lamp house includes a plurality of exhaust elements disposed symmetrically with respect to the gas ejection part for exhausting the gas blown from the gas ejection part against the radiation window to the outside.

The production of symmetric gas flows within the lamp house provides good uniformity of a temperature distribution across the radiation window to improve the uniformity of an in-plane temperature distribution across the substrate.

According to another aspect of the present invention, the heat treatment apparatus comprises: a holding part for holding a substrate; a flash lamp having a rodlike discharge tube for directing a flash of light from the discharge tube toward the substrate held by the holding part; a radiation window disposed between the flash lamp and the holding part for allowing a flash of light directed from the flash lamp to pass therethrough into the holding part; and a gas ejection part for causing a gas to pass by the flash lamp and to be blown against the radiation window.

The gas passing by the flash lamp is blown against the radiation window. Thus, not only the direct cooling of the flash lamp by using the gas but also the decrease in temperature of the radiation window suppresses a lamp temperature rise resulting from radiation from the radiation window, to thereby accomplish the effective cooling of the flash lamp.

It is therefore an object of the present invention to provide a heat treatment apparatus capable of effectively cooling a flash lamp.

It is another object of the present invention to provide a heat treatment apparatus capable of improving the uniformity of an in-plane temperature distribution across a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a side sectional view showing the construction of a heat treatment apparatus according to the present invention;

FIG. 2 is a sectional view showing a gas passage in the heat treatment apparatus of FIG. 1;

FIG. 3 is a plan view showing a hot plate;

FIG. 10 is a perspective view showing an internal structure of a cooling box according to the second preferred embodiment;

DESCRIPTION OF THE PREFERRED EMBODIMENTS

Figure 4:
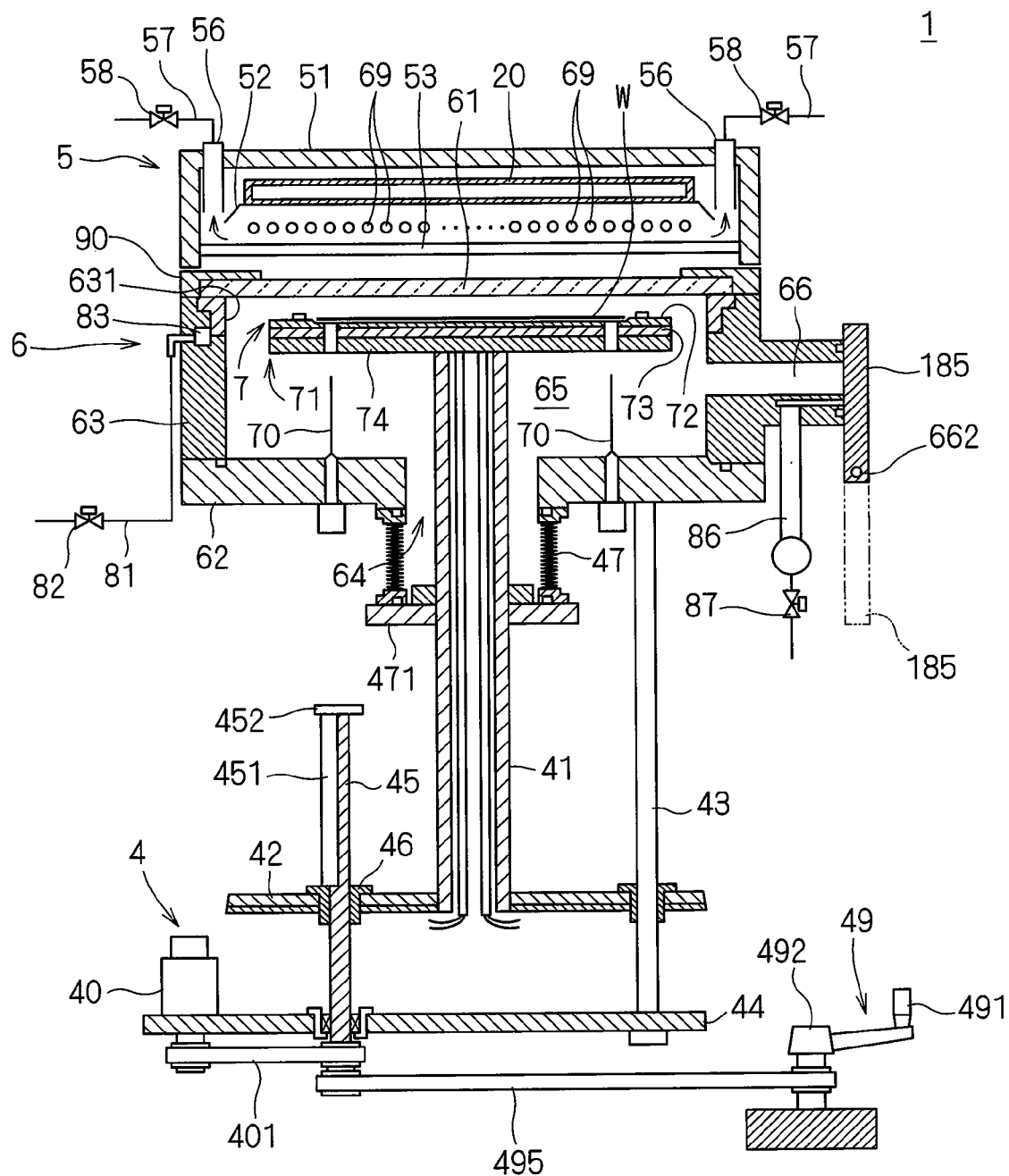
FIG. 4 is a side sectional view showing the construction of the heat treatment apparatus of FIG. 1.

Preferred embodiments according to the present invention will now be described in detail with reference to the drawings.

1. First Preferred Embodiment

First, the overall construction of a heat treatment apparatus according to the present invention will be outlined. FIG. 1 is a side sectional view showing the construction of a heat treatment apparatus 1 according to the present invention. The heat treatment apparatus 1 is a flash lamp annealer for exposing a generally circular semiconductor wafer W serving as a substrate to a flash of light to heat the semiconductor wafer W.

The heat treatment apparatus 1 includes a chamber 6 of a generally cylindrical configuration for receiving a semiconductor wafer W therein, and a lamp house 5 including a plurality of flash lamps 69 incorporated therein. The heat treatment apparatus 1 further includes a controller 3 for controlling operating mechanisms provided in the chamber 6 and the lamp house 5 to cause the operating mechanisms to perform heat treatment on the semiconductor wafer W.

The chamber 6 is provided under the lamp house 5. The chamber 6 includes a chamber side portion 63 having an inner wall of a generally cylindrical configuration, and a chamber bottom portion 62 for covering a bottom portion of the chamber side portion 63. A space surrounded by the chamber side portion 63 and the chamber bottom portion 62 is defined as a heat treatment space 65. A top opening 60 is formed over the heat treatment space 65. A chamber window 61 is mounted in the top opening 60 to close the top opening 60.

The chamber window 61 constituting a ceiling portion of the chamber 6 is a disk-shaped member made of, for example, quartz, and allows light emitted from the lamp house 5 to pass therethrough into the heat treatment space 65. The chamber bottom portion 62 and the chamber side portion 63 which constitute the main body of the chamber 6 are made of, for example, a metal material having high strength and high heat resistance such as stainless steel and the like. A ring 631 provided in an upper portion of the inner side surface of the chamber side portion 63 is made of an aluminum (Al) alloy and the like having greater durability against degradation resulting from exposure to light than stainless steel.

An O-ring provides a seal between the chamber window 61 and the chamber side portion 63 so as to maintain the hermeticity of the heat treatment space 65. Specifically, the O-ring is fitted between a lower peripheral portion of the chamber window 61 and the chamber side portion 63, and a clamp ring 90 abuts against an upper peripheral portion of the chamber window 61 and is secured to the chamber side portion 63 by screws, thereby forcing the chamber window 61 against the O-ring.

The chamber bottom portion 62 is provided with a plurality of (in this preferred embodiment, three) upright support pins 70 extending through a holding part 7 for supporting the lower surface (a surface opposite from a surface onto which light is directed from the lamp house 5) of the semiconductor wafer W. The support pins 70 are made of, for example, quartz, and are easy to replace because the support pins 70 are fixed externally of the chamber 6.

The chamber side portion 63 includes a transport opening 66 for the transport of the semiconductor wafer W therethrough into and out of the chamber 6. The transport opening 66 is openable and closable by a gate valve 185 pivoting about an axis 662. An inlet passage 81 for introducing a processing gas (for example, an inert gas including nitrogen ($N_2$) gas, helium (He) gas, argon (Ar) gas and the like, or oxygen ($O_2$) gas and the like) into the heat treatment space 65 is formed on the opposite side of the chamber side portion 63 from the transport opening 66. The inlet passage 81 has a first end connected through a valve 82 to a gas supply mechanism not shown, and a second end connected to a gas inlet buffer 83 formed inside the chamber side portion 63. The transport opening 66 is provided with an outlet passage 86 for exhausting the gas from the interior of the heat treatment space 65. The outlet passage 86 is connected through a valve 87 to an exhaust mechanism not shown.

FIG. 2 is a sectional view of the chamber 6 taken along a horizontal plane at the level of the gas inlet buffer 83. As shown in FIG. 2, the gas inlet buffer 83 extends over approximately one-third of the inner periphery of the chamber side portion 63 on the opposite side from the transport opening 66 shown in FIG. 1. The processing gas introduced through the inlet passage 81 to the gas inlet buffer 83 is fed through a plurality of gas feed holes 84 into the heat treatment space 65.

The heat treatment apparatus 1 further includes the holding part 7 of a generally disk-shaped configuration for preheating a semiconductor wafer W prior to the exposure of the semiconductor wafer W to a flash of light while holding the semiconductor wafer W in a horizontal position within the chamber 6, and a holding part elevating mechanism 4 for moving the holding part 7 upwardly and downwardly relative to the chamber bottom portion 62 serving as the bottom surface of the chamber 6. The holding part elevating mechanism 4 shown in FIG. 1 includes a shaft 41 of a generally cylindrical configuration, a movable plate 42, guide members 43 (three guide members 43 are actually provided around the shaft 41 in this preferred embodiment), a fixed plate 44, a ball screw 45, a nut 46, and a motor 40. The chamber bottom portion 62 serving as the bottom portion of the chamber 6 is formed with a bottom opening 64 of a generally circular configuration having a diameter smaller than that of the holding part 7. The shaft 41 made of stainless steel is inserted through the bottom opening 64 and connected to the lower surface of the holding part 7 (a hot plate 71 of the holding part 7 in a strict sense) to support the holding part 7.

The nut 46 for threaded engagement with the ball screw 45 is fixed to the movable plate 42. The movable plate 42 is slidably guided by the guide members 43 fixed to the chamber bottom portion 62 and extending downwardly therefrom, and is vertically movable. The movable plate 42 is coupled through the shaft 41 to the holding part 7.

The motor 40 is provided on the fixed plate 44 mounted to the lower end portions of the respective guide members 43, and is connected to the ball screw 45 through a timing belt 401. When the holding part elevating mechanism 4 moves the holding part 7 upwardly and downwardly, the motor 40 serving as a driver rotates the ball screw 45 under the control of the controller 3 to move the movable plate 42 fixed to the nut 46 vertically along the guide members 43. As a result, the shaft 41 fixed to the movable plate 42 moves vertically, whereby the holding part 7 connected to the shaft 41 smoothly moves upwardly and downwardly between a transfer position shown in FIG. 1 in which the semiconductor wafer W is transferred and a treatment position shown in FIG. 4 in which the semiconductor wafer W is treated.

An upright mechanical stopper 451 of a generally semi-cylindrical configuration (obtained by cutting a cylinder in half in a longitudinal direction) is provided on the upper surface of the movable plate 42 so as to extend along the ball screw 45. If the movable plate 42 is to move upwardly beyond a predetermined upper limit because of any anomaly, the upper end of the mechanical stopper 451 strikes an end plate 452 provided at an end portion of the ball screw 45, whereby the abnormal upward movement of the movable plate 42 is prevented. This avoids the upward movement of the holding part 7 above a predetermined position lying under the chamber window 61, to thereby prevent a collision between the holding part 7 and the chamber window 61.

The holding part elevating mechanism 4 further includes a manual elevating part 49 for manually moving the holding part 7 upwardly and downwardly during the maintenance of the interior of the chamber 6. The manual elevating part 49 has a handle 491 and a rotary shaft 492. Rotating the rotary shaft 492 by means of the handle 491 causes the rotation of the ball screw 45 connected through a timing belt 495 to the rotary shaft 492, thereby moving the holding part 7 upwardly and downwardly.

An expandable/contractible bellows 47 surrounding the shaft 41 and extending downwardly from the chamber bottom portion 62 is provided under the chamber bottom portion 62, and has an upper end connected to the lower surface of the chamber bottom portion 62. The bellows 47 has a lower end mounted to a bellows lower end plate 471. The bellows lower end plate 471 is screw-held and mounted to the shaft 41 by a collar member 411. The bellows 47 contracts when the holding part elevating mechanism 4 moves the holding part 7 upwardly relative to the chamber bottom portion 62, and expands when the holding part elevating mechanism 4 moves the holding part 7 downwardly. When the holding part 7 moves upwardly and downwardly, the bellows 47 contracts and expands to maintain the heat treatment space 65 hermetically sealed.

The holding part 7 includes the hot plate (or heating plate) 71 for preheating (or assist-heating) the semiconductor wafer W, and a susceptor 72 provided on the upper surface (a surface on which the holding part 7 holds the semiconductor wafer W) of the hot plate 71. The shaft 41 for moving the holding part 7 upwardly and downwardly as mentioned above is connected to the lower surface of the holding part 7. The susceptor 72 is made of quartz (or may be made of aluminum nitride (AlN) or the like). Pins 75 for preventing the semiconductor wafer W from shifting out of place are mounted on the upper surface of the susceptor 72. The susceptor 72 is provided on the hot plate 71, with the lower surface of the susceptor 72 in face-to-face contact with the upper surface of the hot plate 71. Thus, the susceptor 72 diffuses heat energy from the hot plate 71 to transfer the heat energy to the semiconductor wafer W placed on the upper surface of the susceptor 72, and is removable from the hot plate 71 for cleaning during maintenance.

The hot plate 71 includes an upper plate 73 and a lower plate 74 both made of stainless steel. Resistance heating wires such as nichrome wires for heating the hot plate 71 are provided between the upper plate 73 and the lower plate 74, and an electrically conductive brazing metal containing nickel (Ni) fills the space between the upper plate 73 and the lower plate 74 to seal the resistance heating wires therewith. The upper plate 73 and the lower plate 74 have brazed or soldered ends.

FIG. 3 is a plan view of the hot plate 71. As shown in FIG. 3, the hot plate 71 has a circular zone 711 and an annular zone 712 arranged in concentric relation with each other and positioned in a central portion of a region opposed to the semiconductor wafer W held by the holding part 7, and four zones 713 to 716 into which a substantially annular region surrounding the zone 712 is circumferentially equally divided. Slight gaps are formed between these zones 711 to 716. The hot plate 71 is provided with three through holes 77 receiving the respective support pins 70 therethrough and circumferentially spaced 120° apart from each other in a gap between the zones 711 and 712.

In the six zones 711 to 716, the resistance heating wires independent of each other are disposed so as to make a circuit to form heaters, respectively. The heaters incorporated in the respective zones 711 to 716 individually heat the respective zones. The semiconductor wafer W held by the holding part 7 is heated by the heaters incorporated in the six zones 711 to 716. A sensor 710 for measuring the temperature of each zone by using a thermocouple is provided in each of the zones 711 to 716. The sensors 710 pass through the interior of the generally cylindrical shaft 41 and are connected to the controller 3.

For heating the hot plate 71, the controller 3 controls the amount of power supply to the resistance heating wires provided in the respective zones 711 to 716 so that the temperatures of the six zones 711 to 716 measured by the sensors 710 reach a previously set predetermined temperature. The temperature control in each zone by the controller 3 is PID (Proportional, Integral, Derivative) control. In the hot plate 71, the temperatures of the respective zones 711 to 716 are continually measured until the heat treatment of the semiconductor wafer W (the heat treatment of all semiconductor wafers W when the plurality of semiconductor wafers W are successively heat-treated) is completed, and the amounts of power supply to the resistance heating wires provided in the respective zones 711 to 716 are individually controlled, that is, the temperatures of the heaters incorporated in the respective zones 711 to 716 are individually controlled, whereby the temperatures of the respective zones 711 to 716 are maintained at the set temperature. The set temperature for the zones 711 to 716 may be changed by an individually set offset value from a reference temperature.

The resistance heating wires provided in the six zones 711 to 716 are connected through power lines passing through the interior of the shaft 41 to a power source (not shown). The power lines extending from the power source to the zones 711 to 716 are disposed inside a stainless tube filled with an insulator of magnesia (magnesium oxide) or the like so as to be electrically insulated from each other. The interior of the shaft 41 is open to the atmosphere.

Next, the lamp house 5 will be described. The lamp house 5 includes a light source having the plurality of (in this preferred embodiment, 30) xenon flash lamps (referred to simply as "flash lamps" hereinafter) 69, a reflector 52 provided over the light source so as to cover the light source, and a cooling box 20 provided over the reflector 52. The light source, the reflector 52, and the cooling box 20 are disposed within an enclosure 51. A lamp light radiation window 53 is mounted in a bottom portion of the enclosure 51 of the lamp house 5. The lamp light radiation window 53 constituting a floor portion of the lamp house 5 is a plate-like member made of quartz. The provision of the lamp house 5 over the chamber 6 places the lamp light radiation window 53 in opposed relation to the chamber window 61. The lamp house 5 heats a semiconductor wafer W by directing a flash of light from the flash lamps 69 through the lamp light radiation window 53 and the chamber window 61 onto the semiconductor wafer W held by the holding part 7 within the chamber 6.

The plurality of flash lamps 69 each of which is a rodlike lamp having an elongated cylindrical configuration are arranged in an array in a plane so that the longitudinal directions of the respective flash lamps 69 are in parallel with each other along a major surface of the semiconductor wafer W held by the holding part 7 (in a horizontal direction). The plane defined by the array of the flash lamps 69 is a horizontal plane. Each of the flash lamps 69 includes a rodlike glass tube (or discharge tube) containing xenon gas sealed therein and having positive and negative electrodes provided on opposite ends thereof and connected to a capacitor, and a trigger electrode wound on the outer peripheral surface of the glass tube. Because the xenon gas is electrically insulative, no current flows in the discharge tube in a normal state. However, if a high voltage is applied to the trigger electrode to produce an electrical breakdown, electricity stored in the capacitor flows momentarily in the discharge tube, and the Joule heat evolved at this time heats the xenon gas to cause light emission. The flash lamps 69 have the property of being capable of emitting much intenser light than a light source that stays lit continuously because previously stored electrostatic energy is converted into an ultrashort light pulse ranging from 0.1 millisecond to 10 milliseconds. The discharge tube of each of the flash lamps 69 according to the first preferred embodiment has a diameter of about 13 mm, and a spacing between adjacent ones of the flash lamps 69 in the lamp array is about 2 mm. A distance between the reflector 52 and the flash lamps 69 is about 20 mm, and a distance between the flash lamps 69 and the lamp light radiation window 53 is about 5 mm.

Figure 5:
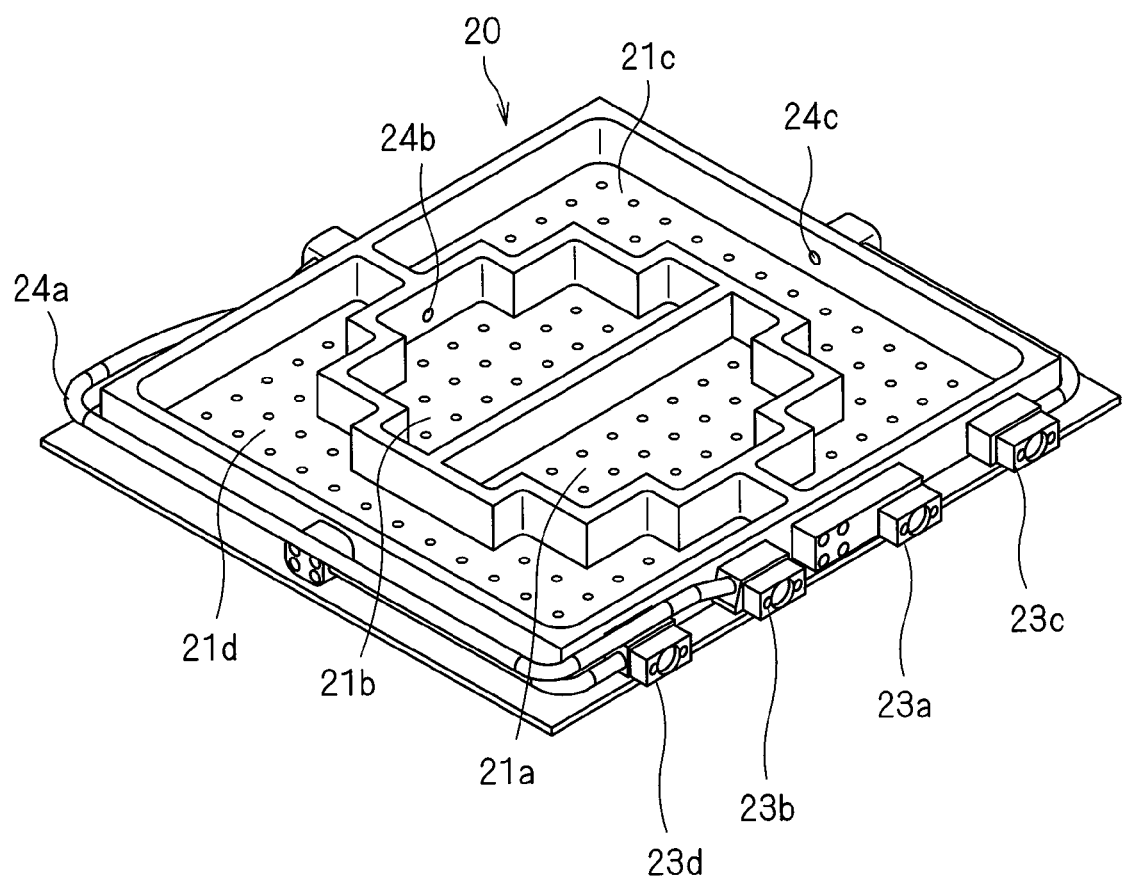
FIG. 5 is a perspective view showing an internal structure of a cooling box according to a first preferred embodiment of the present invention.

FIG. 5 is a perspective view showing an internal structure of the cooling box 20 according to the first preferred embodiment. FIG. 5 schematically illustrates a gas supply mechanism for the cooling box 20. The cooling box 20 is a box-shaped member of a rectangular plan configuration with a buffer space 21 incorporated therein, and is disposed in face-to-face contact with the upper surface of the reflector 52 which is a reflecting plate for the flash lamps 69. The fundamental function of the reflector 52 is to reflect a flash of light emitted from the plurality of flash lamps 69 toward the holding part 7. The reflector 52 is a plate made of an aluminum (Al) alloy, and has a surface (a surface facing the flash lamps 69) roughened by abrasive blasting to produce a satin finish thereon. The reason for such roughening is that the reflector 52 having a perfect mirror surface causes a regular pattern in the intensity of the light reflected from the plurality of flash lamps 69 to deteriorate the uniformity of the surface temperature distribution across the semiconductor wafer W. The reflector 52 may be affixed to the outer surface of the bottom portion of the cooling box 20. Alternatively, the reflector 52 and the cooling box 20 may be formed integrally.

The buffer space 21 inside the cooling box 20 is divided into four compartments, i.e., subspaces 21a, 21b, 21c and 21d. The cooling box 20 includes a top plate (not shown in FIG. 5) mounted over the structure shown in FIG. 5. With the top plate mounted over the structure shown in FIG. 5, the atmospheres in the respective subspaces 21a, 21b, 21c and 21d are isolated from each other by a partition wall. The bottom surface of each of the four subspaces 21a, 21b, 21c and 21d is formed with a plurality of jet openings 22. The jet openings 22 are formed through a lower wall surface of the cooling box 20 and the reflector 52. Each of the jet openings 22 is an cylindrical hole having a diameter ranging from 0.5 mm to 1.5 mm, and is formed so that the axis of the cylindrical hole extends in a vertical direction. Each of the jet openings 22 has an upper end open to communicate with the buffer space 21, and has a lower end open toward the light source including the plurality of flash lamps 69. In other words, the jet openings 22 are provided so as to extend from the buffer space 21 toward the light source.

As shown in FIG. 5, four gas supply ports 23a, 23b, 23c and 23d are provided on an outer side wall of the cooling box 20. The gas supply port 23b is in communication with an opening 24b for the subspace 21b via a pipe 24a routed around the outer walls of the cooling box 20 and via a pipe formed to extend through the interior of the partition wall for partitioning the buffer space 21. Similarly, the gas supply port 23a is in communication with an opening (positioned in symmetric relation to the opening 24b) for the subspace 21a via a pipe formed to extend through the interior of the partition wall. The gas supply port 23c, on the other hand, is in communication with an opening 24c for the subspace 21c via a pipe surrounding the outer walls. Similarly, the gas supply port 23d is in communication with an opening (positioned in symmetric relation to the opening 24c) for the subspace 21d via a pipe surrounding the outer walls.

A gas supply mechanism 30 supplies a predetermined gas (in this preferred embodiment, nitrogen gas) into the buffer space 21 of the cooling box 20. The gas supply mechanism 30 includes a manual valve 31, a regulator 32, an air-operated valve 33, and a filter 34 which are inserted in a gas pipe 37. The gas pipe 37 has a proximal end connected in communication with a nitrogen gas supply source 99. The nitrogen gas supply source 99 used herein may employ a utility system in a factory in which the heat treatment apparatus 1 is installed.

The gas pipe 37, on the other hand, has a distal end divided into four paths, i.e., branch pipes 37a, 37b, 37c and 37d. The four branch pipes 37a, 37b, 37c and 37d are connected to the gas supply ports 23a, 23b, 23c and 23d, respectively. Thus, the four subspaces 21a, 21b, 21c and 21d into which the buffer space 21 is divided are connected in communication with the nitrogen gas supply source 99 via the gas pipe 37.

The manual valve 31 is a valve for manually opening and closing the gas pipe 37. The regulator 32 regulates the pressure of the nitrogen gas passing through the gas pipe 37. The air-operated valve 33 is provided to close the gas pipe 37 when the power is shut off, and is open when the heat treatment apparatus 1 is in normal operation. The filter 34 removes fine particles and the like from the nitrogen gas passing through the gas pipe 37 to purify the nitrogen gas. The manual valve 31 and the air-operated valve 33 are opened and the regulator 32 regulates the pressure based on a set value, whereby the nitrogen gas at a predetermined pressure fed from the nitrogen gas supply source 99 to the gas pipe 37 is separated and flows into the four branch pipes 37a, 37b, 37c and 37d. In other words, the gas supply mechanism 30 supplies the nitrogen gas individually to the four subspaces 21a, 21b, 21c and 21d.

Needle valves 35a, 35b, 35c and 35d, and flow meters 36a, 36b, 36c and 36d are inserted in the four branch pipes 37a, 37b, 37c and 37d, respectively. Each of the needle valves 35a, 35b, 35c and 35d adjusts the flow rate of nitrogen gas flowing through a corresponding one of the branch pipes 37a, 37b, 37c and 37d. Each of the flow meters 36a, 36b, 36c and 36d measures the flow rate of nitrogen gas flowing through a corresponding one of the branch pipes 37a, 37b, 37c and 37d. Each of the needle valves 35a, 35b, 35c and 35d adjusts the flow rate, based on a set value, to thereby accomplish the individual adjustment of the flow rates of nitrogen gas supplied from the gas supply mechanism 30 to the four subspaces 21a, 21b, 21c and 21d. Specifically, the controller 3 may automatically adjust the set values of the respective needle valves 35a, 35b, 35c and 35d, based on the measurement results of the flow meters 36a, 36b, 36c and 36d. Alternatively, an operator of the heat treatment apparatus 1 may manually adjust the set values of the respective needle valves 35a, 35b, 35c and 35d while monitoring the flow meters 36a, 36b, 36c and 36d. In place of the flow meters and the needle valves, mass flow meters having the functions of both the flow meters and the needle valves may be inserted in the branch pipes 37a, 37b, 37c and 37d, respectively.

The nitrogen gas supplied through the four branch pipes 37a, 37b, 37c and 37d is temporarily stored in the subspaces 21a, 21b, 21c and 21d, and is then ejected from the jet openings 22 formed in each of the subspaces 21a, 21b, 21c and 21d toward the light source. The pressure of the nitrogen gas in the buffer space 21 at this time is slightly greater than atmospheric pressure.

Figure 7:
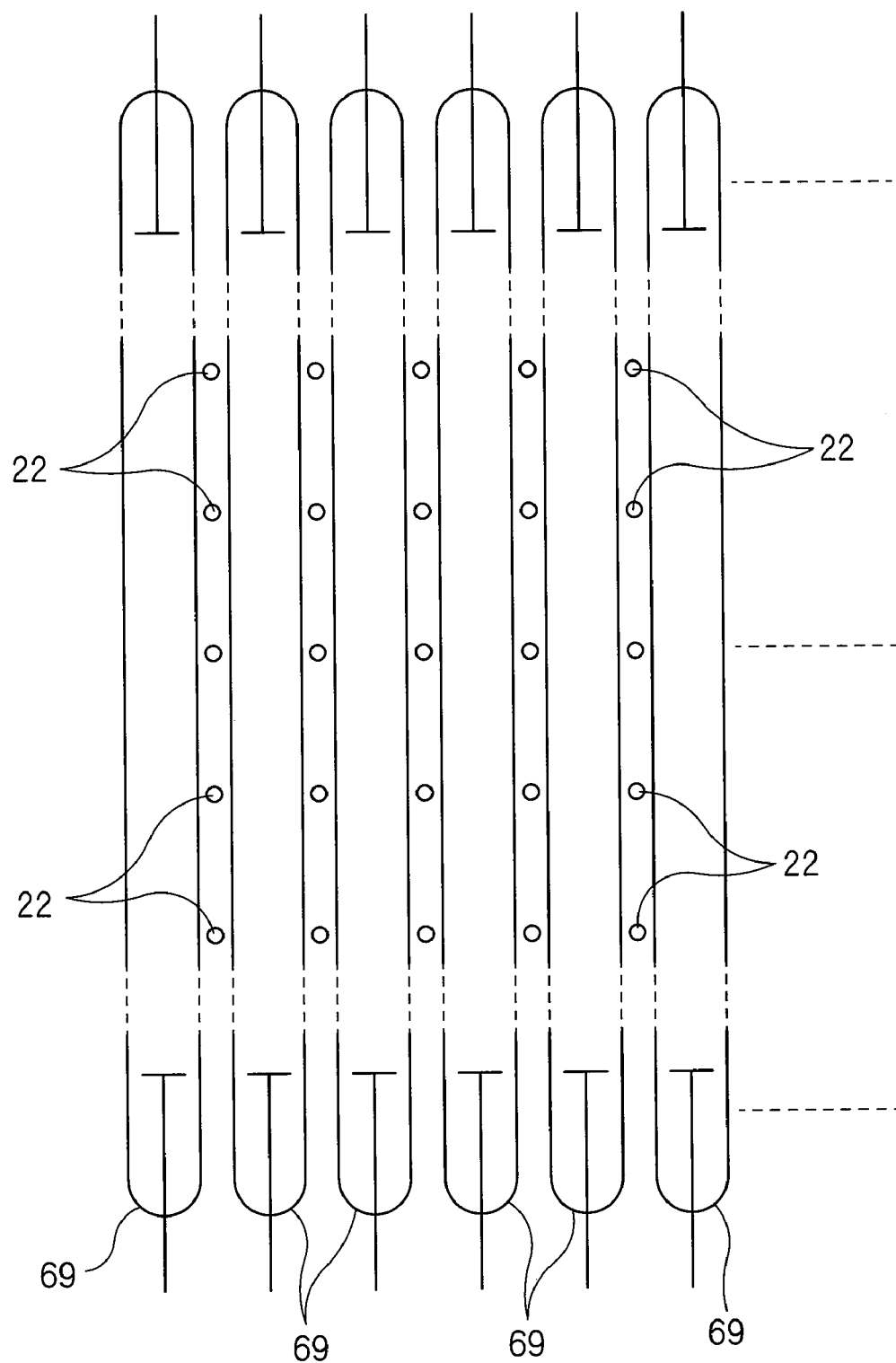
FIG. 7 is a plan view showing the arrangement of jet openings according to the first preferred embodiment.
Figure 8:
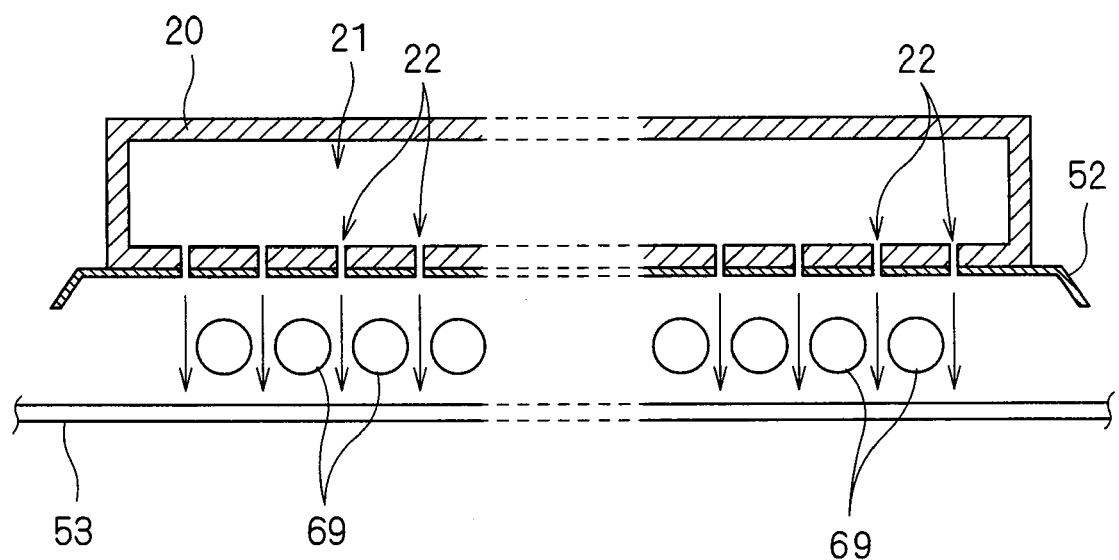
FIG. 8 shows a gas ejected from the jet openings toward a light source.

FIG. 7 is a plan view showing the arrangement of the jet openings 22 according to the first preferred embodiment. The plurality of jet openings 22 according to the first preferred embodiment are arranged in the form of a square-lattice in the bottom surface of each of the subspaces of the cooling box 20, and are positioned just over gaps between the plurality of flash lamps 69 in the lamp array. Thus, the nitrogen gas supplied into the subspaces 21a, 21b, 21c and 21d is ejected from the plurality of jet openings 22 toward the gaps between adjacent ones of the flash lamps 69, as shown in FIG. 8. The ejected nitrogen gas passes through the gaps between adjacent ones of the flash lamps 69 without being obstructed by the flash lamps 69. The nitrogen gas ejected from the jet openings 22 and passing through the gaps between adjacent ones of the flash lamps 69 is then blown against the lamp light radiation window 53, as illustrated in FIG. 8.

The flow rates of nitrogen gas supplied to the four subspaces 21a, 21b, 21c and 21d are individually adjustable in the first preferred embodiment. The flow rates of nitrogen gas ejected from the jet openings 22 in the subspaces are accordingly adjusted on a subspace-by-subspace basis. As a result, the flow rate of nitrogen gas blown against the lamp light radiation window 53 varies depending on regions lying over the lamp light radiation window 53.

Referring again to FIGS. 1 and 4, the lamp house 5 is provided with a pair of exhaust outlets 56. The pair of exhaust outlets 56 are connected in communication with an exhaust mechanism not shown via exhaust pipes 57, respectively. Exhaust valves 58 are inserted in the respective exhaust pipes 57. By opening the exhaust valves 58, the gas within the lamp house 5 is exhausted through the exhaust outlets 56 to the outside. Although the pair of exhaust pipes 57 and the pair of exhaust valves 58 are shown in FIGS. 1 and 4, the exhaust pipes 57 connecting with the pair of exhaust outlets 56 may be joined together and a common exhaust valve 58 may be inserted therein. The nitrogen gas ejected from the cooling box 20 toward the light source passes through the gaps between the flash lamps 69, and then reaches the lamp light radiation window 53. Thereafter, the nitrogen gas is formed into a pair of gas flows directed along the upper surface of the lamp light radiation window 53 toward the pair of exhaust outlets 56. The pair of gas flows are sucked out and exhausted through the pair of exhaust outlets 56.

In the first preferred embodiment, the pair of exhaust outlets 56 are positioned symmetrically with respect to the cooling box 20 within the lamp house 5. That is, the pair of exhaust outlets 56 exhaust the gas in two directions from the lamp house 5, and the gas flows produced within the lamp house 5 by exhausting the gas are symmetric.

The controller 3 shown in FIGS. 1 and 4 is similar in hardware construction to a typical computer. Specifically, the controller 3 includes a CPU for performing various computation processes, a ROM or read-only memory for storing a basic program therein, a RAM or readable/writable memory for storing various pieces of information therein, a magnetic disk for storing control software and data therein, and the like. The controller 3 controls the motor 40, the valves 82 and 87, a feeder circuit for the flash lamps 69, a feeder circuit for the heaters of the hot plate 71, the exhaust valves 58, and the gas supply mechanism 30.

The heat treatment apparatus 1 according to the first preferred embodiment includes a cooling structure (not shown) to prevent an excessive temperature rise in the chamber 6 because of the heat energy generated from the flash lamps 69 and the hot plate 71 during the heat treatment of the semiconductor wafer W. Specifically, the chamber side portion 63 and the chamber bottom portion 62 of the chamber 6 are provided with a water cooling tube to exhaust the heat from the chamber 6.

Next, a procedure for the treatment of a semiconductor wafer W in the heat treatment apparatus 1 will be briefly described. The semiconductor wafer W to be treated herein is a semiconductor substrate doped with impurities by an ion implantation process. The activation of the implanted impurities is achieved by a flash heating process in the heat treatment apparatus 1.

First, the holding part 7 is moved downwardly from the treatment position shown in FIG. 4 to the transfer position shown in FIG. 1. The "treatment position" is a position in which the holding part 7 lies when the semiconductor wafer W is exposed to a flash of light emitted from the flash lamps 69. The "treatment position" is the position of the holding part 7 shown in FIG. 4 within the chamber 6. The "transfer position" is a position in which the holding part 7 lies when the semiconductor wafer W is transported into and out of the chamber 6. The "transfer position" is the position of the holding part 7 shown in FIG. 1 within the chamber 6. The reference position of the holding part 7 in the heat treatment apparatus 1 is the treatment position, and the holding part 7 is in the treatment position prior to the treatment. For the start of the treatment, the holding part 7 is moved downwardly to the transfer position. After the holding part 7 is moved downwardly to the transfer position, the holding part 7 is in close proximity to the chamber bottom portion 62, and the upper ends of the support pins 70 protrude through the holding part 7 upwardly out of the holding part 7, as shown in FIG. 1.

Next, when the holding part 7 is moved downwardly to the transfer position, the valve 82 and the valve 87 are opened to introduce nitrogen gas at room temperature into the heat treatment space 65 of the chamber 6. Subsequently, the transport opening 66 is opened by opening the gate valve 185, and a transport robot outside the heat treatment apparatus 1 transports the ion-implanted semiconductor wafer W through the transport opening 66 into the chamber 6 and places the semiconductor wafer W onto the plurality of support pins 70.

The amount of nitrogen gas fed into the chamber 6 during the transport of the semiconductor wafer W into the chamber 6 shall be about 40 liters per minute. The nitrogen gas fed in the chamber 6 flows from the gas inlet buffer 83 in a direction indicated by the arrows AR4 of FIG. 2, and is exhausted through the outlet passage 86 and the valve 87 shown in FIG. 1 by using a utility exhaust system. Part of the nitrogen gas fed into the chamber 6 is also exhausted from a discharge outlet (not shown) provided inside the bellows 47. In steps to be described below, the nitrogen gas always continues to be fed into and exhausted from the chamber 6, and the amount of nitrogen gas fed into the chamber 6 is changed to various amounts in accordance with the process steps of the semiconductor wafer W.

After the semiconductor wafer W is transported into the chamber 6, the gate valve 185 closes the transport opening 66. Next, the holding part elevating mechanism 4 moves the holding part 7 upwardly from the transfer position to the treatment position close to the chamber window 61. In the course of the upward movement of the holding part 7 from the transfer position, the semiconductor wafer W is transferred from the support pins 70 to the susceptor 72 of the holding part 7, and is placed and held on the upper surface of the susceptor 72. When the holding part 7 is moved upwardly to the treatment position, the semiconductor wafer W placed on the susceptor 72 is also held in the treatment position.

Each of the six zones 711 to 716 of the hot plate 71 is already heated up to a predetermined temperature by the heater (the resistance heating wire) individually provided within each of the zones 711 to 716 (between the upper plate 73 and the lower plate 74). The holding part 7 is moved upwardly to the treatment position and the semiconductor wafer W comes in contact with the holding part 7, whereby the semiconductor wafer W is preheated by the heaters incorporated in the hot plate 71, and the temperature of the semiconductor wafer W increases gradually.

Preheating the semiconductor wafer W in the treatment position for about 60 seconds increases the temperature of the semiconductor wafer W up to a previously set preheating temperature T1. The preheating temperature T1 shall range from about 200° C. to about 600° C., preferably from about 350° C. to about 550° C., at which there is no apprehension that the impurities implanted in the semiconductor wafer W are diffused by heat. A distance between the holding part 7 and the chamber window 61 is adjustable to any value by controlling the amount of rotation of the motor 40 of the holding part elevating mechanism 4.

After a lapse of the preheating time of about 60 seconds, a flash of light is emitted from the flash lamps 69 of the lamp house 5 toward the semiconductor wafer W under the control of the controller 3 while the holding part 7 remains in the treatment position. Part of the light emitted from the flash lamps 69 travels directly to the holding part 7 within the chamber 6. The remainder of the light is reflected by the reflector 52, and the reflected light travels to the interior of the chamber 6. Such emission of the flash of light achieves the flash heating of the semiconductor wafer W. The flash heating, which is achieved by the emission of a flash of light from the flash lamps 69, can raise the surface temperature of the semiconductor wafer W in a short time.

Specifically, the flash of light emitted from the flash lamps 69 of the lamp house 5 is an intense flash of light emitted for an extremely short period of time ranging from about 0.1 millisecond to about 10 milliseconds because the previously stored electrostatic energy is converted into such an ultrashort light pulse. The surface temperature of the semiconductor wafer W subjected to the flash heating by the emission of the flash of light from the flash lamps 69 momentarily rises to a treatment temperature T2 of about 1000° C. to about 1100° C. After the impurities implanted in the semiconductor wafer W are activated, the surface temperature decreases rapidly. Because of the capability of increasing and decreasing the surface temperature of the semiconductor wafer W in an extremely short time, the heat treatment apparatus 1 can achieve the activation of the impurities while suppressing the diffusion of the impurities implanted in the semiconductor wafer W due to heat. Such a diffusion phenomenon is also known as a round or dull profile of the impurities implanted in the semiconductor wafer W. Because the time required for the activation of the implanted impurities is extremely short as compared with the time required for the thermal diffusion of the implanted impurities, the activation is completed in a short time ranging from about 0.1 millisecond to about 10 milliseconds during which no diffusion occurs.

Preheating the semiconductor wafer W by the holding part 7 prior to the flash heating allows the emission of the flash of light from the flash lamps 69 to rapidly increase the surface temperature of the semiconductor wafer W up to the treatment temperature T2.

After waiting in the treatment position for about 10 seconds following the completion of the flash heating, the holding part 7 is moved downwardly again to the transfer position shown in FIG. 1 by the holding part elevating mechanism 4, and the semiconductor wafer W is transferred from the holding part 7 to the support pins 70. Subsequently, the gate valve 185 opens the transport opening 66 having been closed, and the transport robot outside the heat treatment apparatus 1 transports the semiconductor wafer W placed on the support pins 70 outwardly. Thus, the flash heating process of the semiconductor wafer W in the heat treatment apparatus 1 is completed.

As discussed above, the nitrogen gas is continuously fed into the chamber 6 during the heat treatment of the semiconductor wafer W in the heat treatment apparatus 1. The amount of nitrogen gas fed into the chamber 6 shall be about 30 liters per minute when the holding part 7 is in the treatment position, and be about 40 liters per minute when the holding part 7 is in other than the treatment position.

The repeated execution of a series of flash heating processes as discussed above causes gradual accumulation of heat in the discharge tubes of the flash lamps 69 to increase the temperature thereof. This results mainly from the influence of the radiant heat from the hot plate 71 of the holding part 7, rather than from the influence of the instantaneous emission of pulsed light from the flash lamps 69 themselves. Specifically, the temperature of the hot plate 71 is raised up to about 200° C. to about 600° C. for the preheating of the semiconductor wafer W, and far infrared radiation of a relatively long wavelength emanates from the hot plate 71. Infrared radiation of a long wavelength is absorbed also by quartz. For this reason, the infrared radiation emanating from the hot plate 71 is first absorbed by the quartz chamber window 61 of the chamber 6 to raise the temperature of the chamber window 61. In particular, since the reference position of the holding part 7 is the treatment position in close proximity to the chamber window 61 in the heat treatment apparatus 1 according to the first preferred embodiment, the hot plate 71 is in close proximity to the chamber window 61 except when the semiconductor wafer W is transported into and out of the chamber 6, and the temperature of the chamber window 61 is easily raised by the radiant heat from the hot plate 71.

As the temperature of the chamber window 61 rises, infrared radiation of a long wavelength emanates also from the chamber window 61, to thereby raise the temperature of the lamp light radiation window 53 (made of quartz) of the lamp house 5. Then, infrared radiation of a long wavelength emanates also from the lamp light radiation window 53 at a raised temperature, and is absorbed by the discharge tubes (made of quartz) of the flash lamps 69 to raise the temperature of the flash lamps 69. Part of the infrared radiation emanating from the hot plate 71 passes through the chamber window 61 and the lamp light radiation window 53 to directly heat the discharge tubes of the flash lamps 69. In this manner, the discharge tubes of the flash lamps 69 are heated directly by the radiant heat from the hot plate 71 or indirectly via the chamber window 61 and the lamp light radiation window 53. Because of the continuous emanation of the infrared radiation from the hot plate 71, heat is gradually accumulated in the flash lamps 69 to raise the temperature of the flash lamps 69. The temperature of the flash lamps 69 is also raised by the radiant heat from the preheated semiconductor wafer W.

In contrast, the semiconductor wafer W held by the holding part 7 is also thermally affected by the chamber window 61 and the lamp light radiation window 53. Specifically, infrared radiation emanates from the lamp light radiation window 53 at a raised temperature not only toward the flash lamps 69 but also toward the chamber window 61. The infrared radiation emanating from the lamp light radiation window 53 toward the chamber window 61 is absorbed by the chamber window 61 to exert a thermal effect on the chamber window 61. Then, infrared radiation emanates also from the chamber window 61 toward the holding part 7, and reaches the semiconductor wafer W held by the holding part 7 to exert an influence on the temperature of the semiconductor wafer W.

For this reason, the heat treatment apparatus 1 according to the first preferred embodiment is adapted to eject the nitrogen gas from the jet openings 22 of the cooling box 20 toward the light source. The nitrogen gas ejected from the jet openings 22 passes through the gaps between adjacent ones of the flash lamps 69 in the lamp array (or passes by the flash lamps 69), and is then blown against the lamp light radiation window 53. The ejected nitrogen gas makes a heat exchange with the discharge tubes to cool down the flash lamps 69 when passing through the gaps between adjacent ones of the flash lamps 69. The ejected nitrogen gas further makes a heat exchange by being blown against the lamp light radiation window 53, to cool down the lamp light radiation window 53. That is, the cooling box 20 ejects the nitrogen gas toward the light source to thereby cool down not only the flash lamps 69 but also the lamp light radiation window 53.

In this manner, the plurality of flash lamps 69 constituting the light source are cooled down directly by the nitrogen gas ejected from the cooling box 20. Additionally, the lamp light radiation window 53 is cooled down to a lowered temperature, whereby the temperature rise due to the radiation from the lamp light radiation window 53 is suppressed. From the standpoint of the flash lamps 69, the lamp light radiation window 53 is a main heat source from which the flash lamps 69 directly receive infrared radiation, and the cooling of the lamp light radiation window 53 means the decrease in the factors responsible for the heating of the flash lamps 69 because of the decrease in temperature of the main heat source. As a result, both the direct cooling using the nitrogen gas and the decrease in temperature of the lamp light radiation window 53 accomplish the effective cooling of the plurality of flash lamps 69. The effective cooling of the flash lamps 69 not only prevents the deterioration of the flash lamps 69 to increase the lifetime of the flash lamps 69 but also allows a high setting of the preheating temperature of the semiconductor wafer W by the hot plate 71, thereby achieving wide treating conditions of the annealing process of the semiconductor wafer W.

Figure 6:
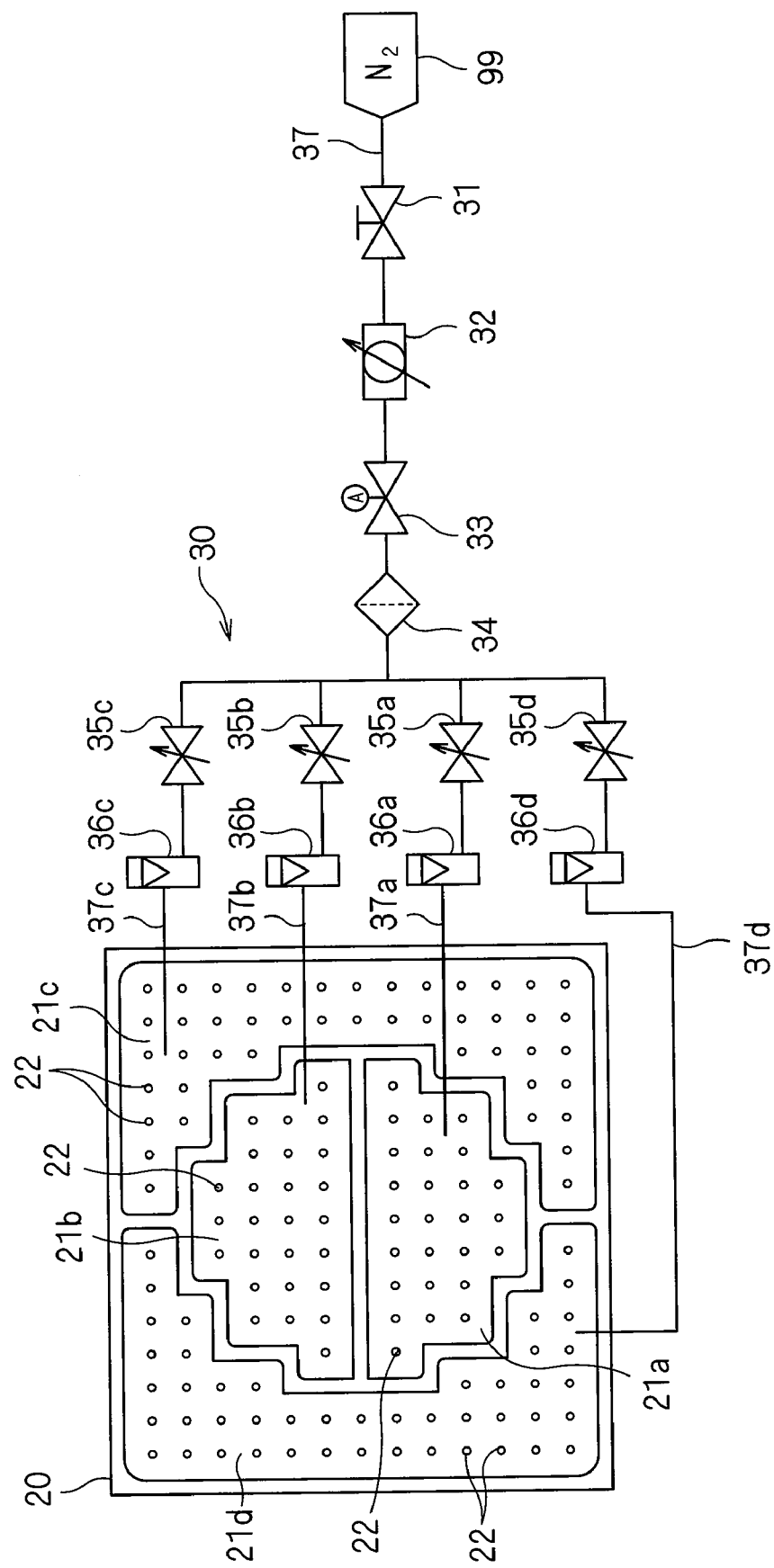
FIG. 6 schematically illustrates a gas supply mechanism for the cooling box shown in FIG. 5.

Further, the four subspaces 21a, 21b, 21c and 21d are arranged in symmetrically partitioned relation in the first preferred embodiment, as shown in FIGS. 5 and 6. More strictly speaking, the subspaces 21a and 21b are arranged in symmetric relation to each other with respect to a central axis of the cooling box 20 extending in a vertical direction, and the subspaces 21c and 21d are arranged in symmetric relation to each other with respect to the central axis. In each of the subspaces 21a, 21b, 21c and 21d, the jet openings 22 are equidistantly spaced relative to each other to form a square-lattice. Additionally, since the nitrogen gas supplied from the gas supply mechanism 30 is temporarily stored in the buffer space 21 and is then ejected from the plurality of jet openings 22, uniform nitrogen gas flows are ejected from the plurality of jet openings 22. Thus, the flows of nitrogen gas produced by the ejection from the cooling box 20 are symmetric with respect to the central axis of the cooling box 20 extending in a vertical direction.

The pair of exhaust outlets 56, on the other hand, are positioned symmetrically with respect to the cooling box 20 within the lamp house 5. Thus, flows of nitrogen gas produced within the lamp house 5 by exhausting the gas through the pair of exhaust outlets 56 are symmetric with respect to the above-mentioned central axis of the cooling box 20. As a result, the flows of nitrogen gas produced within the lamp house 5 by the cooling box 20 and the pair of exhaust outlets 56, that is, the flows of nitrogen gas directed along the upper surface of the lamp light radiation window 53 toward the pair of exhaust outlets 56 are symmetric with respect to the above-mentioned central axis of the cooling box 20.

Thus, the flows of nitrogen gas symmetric with respect to the central axis of the cooling box 20 cool down the lamp light radiation window 53 to provide good uniformity of the temperature distribution across the lamp light radiation window 53. The good uniformity of a temperature distribution across the lamp light radiation window 53 provides good uniformity of a temperature distribution across the chamber window 61 disposed in opposed relation to the lamp light radiation window 53, and further improves the uniformity of an in-plane temperature distribution across the semiconductor wafer W held in opposed relation to and in close proximity to the chamber window 61 by the holding part 7.

If the temperature distribution across the lamp light radiation window 53 becomes nonuniform, the needle valves 35a, 35b, 35c and 35d according to the first preferred embodiment may be used to individually adjust the flow rates of nitrogen gas supplied to the four subspaces 21a, 21b, 21c and 21d, respectively. This allows the individual adjustment of the flow rates of nitrogen gas blown against the respective regions of the lamp light radiation window 53 positioned under the subspaces of the cooling box 20, thereby easily eliminating the nonuniformity of the temperature distribution occurring across the lamp light radiation window 53. As an example, if there is a tendency for the lamp light radiation window 53 to be extremely higher in temperature in a peripheral portion thereof than in a central portion thereof, the adjustment is made so that the nitrogen gas is supplied at higher flow rates to the subspaces 21c and 21d of the cooling box 20 corresponding to the peripheral portion of the lamp light radiation window 53. This increases the flow rates of nitrogen gas blown against the peripheral portion of the lamp light radiation window 53 to decrease the temperature of the peripheral portion of the lamp light radiation window 53, thereby eliminating the nonuniformity of the temperature distribution across the lamp light radiation window 53. As a result, this improves the in-plane temperature distribution across the semiconductor wafer W held by the holding part 7.

2. Second Preferred Embodiment

Figure 9:
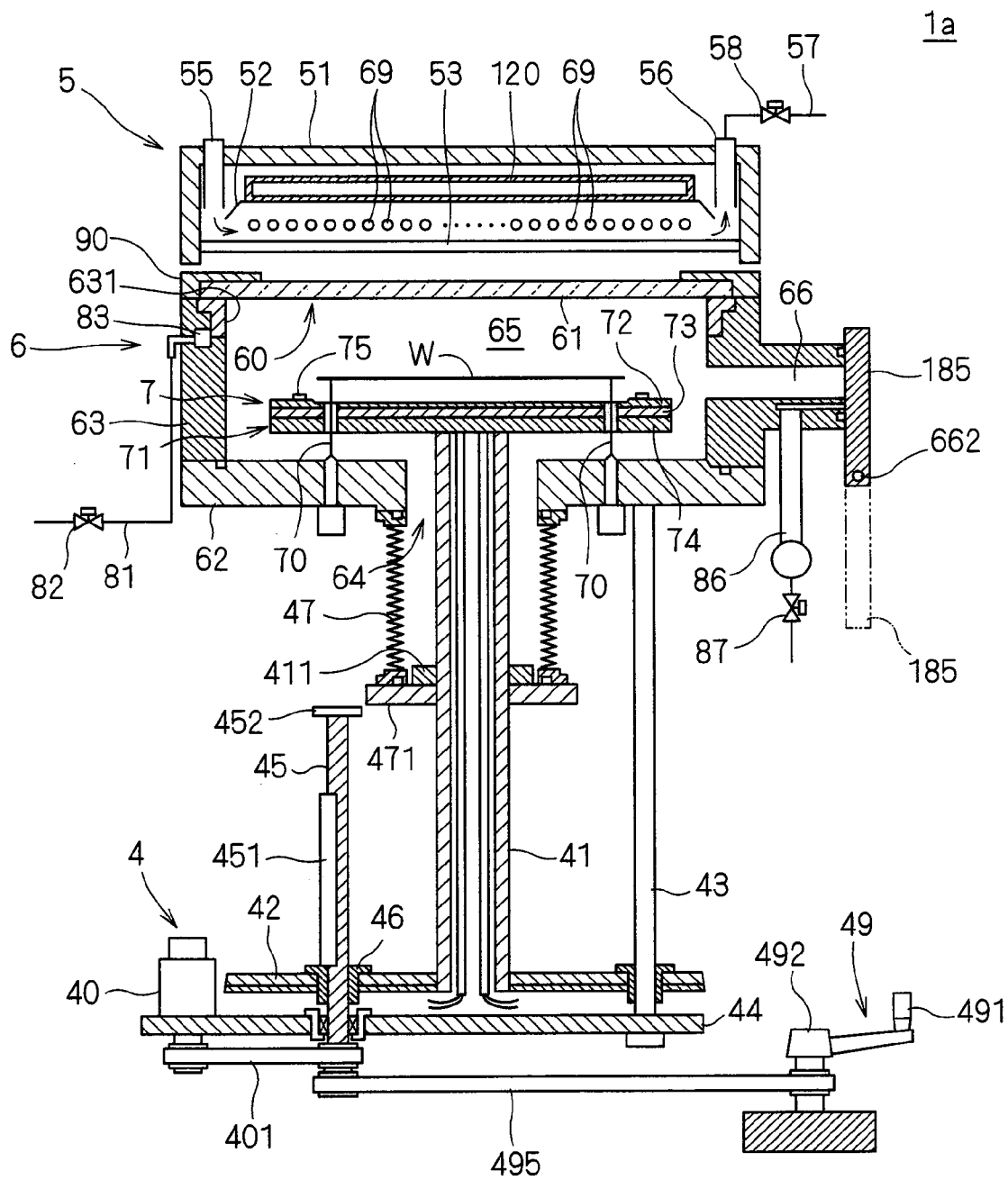
FIG. 9 is a side sectional view showing the construction of a heat treatment apparatus according to a second preferred embodiment of the present invention.

Next, a second preferred embodiment according to the present invention will be described. FIG. 9 is a side sectional view showing the construction of a heat treatment apparatus 1a according to the second preferred embodiment of the present invention. Components in FIG. 9 identical with those of the first preferred embodiment are designated by like reference numerals and characters illustrated in FIGS. 1 and 4. The heat treatment apparatus 1a according to the second preferred embodiment differs in gas supply and exhaust mechanisms in the lamp house 5 from the heat treatment apparatus 1 according to the first preferred embodiment.

Although the pair of exhaust outlets 56 are provided in the lamp house 5 according to the first preferred embodiment, a suction inlet 55 is provided in place of one of the exhaust outlets 56 in the lamp house 5 according to the second preferred embodiment. That is, the suction inlet 55 and the exhaust outlet 56 are provided in the lamp house 5, as shown in FIG. 9. The exhaust outlet 56 is connected in communication with an exhaust mechanism not shown via the exhaust pipe 57. The exhaust valve 58 is inserted in the exhaust pipe 57. By opening the exhaust valve 58, a negative pressure is exerted on the interior of lamp house 5 through the exhaust outlet 56. As a result, outside air is sucked into the lamp house 5 through the suction inlet 55. The lamp house 5 is designed so that the air sucked into the lamp house 5 through the suction inlet 55 flows between the reflector 52 and the lamp light radiation window 53, that is, around the plurality of flash lamps 69 in a generally horizontal direction, and is exhausted through the exhaust outlet 56. An air supply mechanism for supplying air to the suction inlet 55 may be additionally provided.

In the second preferred embodiment, the exhaust outlet 56 is provided only on one side of a cooling box 120, and the suction inlet 55 is provided on the other side thereof opposite from the one side. Thus, the one-sided exhausting of the gas through the exhaust outlet 56 on one side of the cooling box 120 produces a one-way gas flow (or an asymmetric gas flow) directed from the suction inlet 55 toward the exhaust outlet 56 within the lamp house 5.

Such a one-way gas flow is directed between the reflector 52 and the lamp light radiation window 53, that is, along the upper surface of the lamp light radiation window 53 the temperature of which is raised by the radiant heat from the hot plate 71 and the semiconductor wafer W. This creates a temperature gradient along the one-way gas flow to result in a significantly nonuniform temperature distribution across the lamp light radiation window 53. Specifically, a first portion of the lamp light radiation window 53 which is closer to the suction inlet 55 is effectively cooled down so that the temperature of the first portion is greatly decreased because the first portion is always in contact with the gas flow at ordinary temperature. On the other hand, a second portion of the lamp light radiation window 53 which is closer to the exhaust outlet 56 is not cooled down so much so that the temperature of the second portion is decreased slightly because the second portion is always in contact with the gas flow the temperature of which is raised to some extent within the lamp house 5. As a result, a temperature gradient such that the temperature increases in a direction from the suction inlet 55 toward the exhaust outlet 56 is created across the lamp light radiation window 53.

Figure 11:
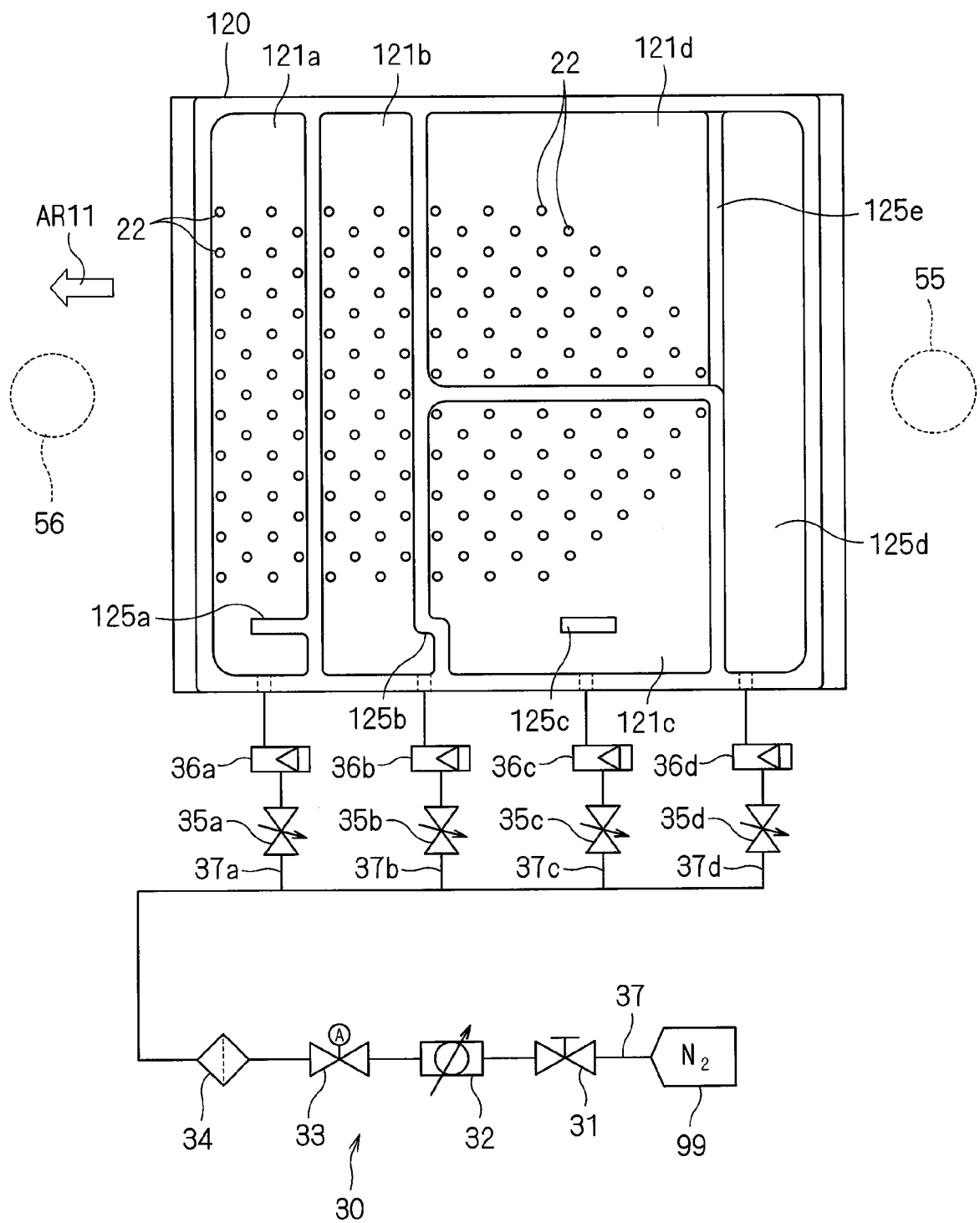
FIG. 11 schematically illustrates a gas supply mechanism for the cooling box shown in FIG. 10.

The temperature gradient created across the lamp light radiation window 53 exerts a thermal effect on the semiconductor wafer W held by the holding part 7 to make the in-plane temperature distribution across the semiconductor wafer W nonuniform. To solve such a problem, the cooling box 120 as shown in FIGS. 10 and 11 is provided in the lamp house 5 according to the second preferred embodiment.

FIG. 10 is a perspective view showing an internal structure of the cooling box 120 according to the second preferred embodiment. FIG. 11 schematically illustrates a gas supply mechanism for the cooling box 120. The cooling box 120 is a box-shaped member of a rectangular plan configuration with a buffer space 121 incorporated therein, and is disposed in face-to-face contact with the upper surface of the reflector 52 which is a reflecting plate for the flash lamps 69. The cooling box 120 according to the second preferred embodiment is generally similar in external configuration to the cooling box 20 according to the first preferred embodiment, and the reflector 52 according to the second preferred embodiment is similar in construction and function to that according to the first preferred embodiment.

The buffer space 121 inside the cooling box 120 is divided into four compartments, i.e., subspaces 121a, 121b, 121c and 121d. The cooling box 120 includes a top plate (not shown in FIG. 10) mounted over the structure shown in FIG. 10. With the top plate mounted over the structure shown in FIG. 10, the atmospheres in the respective subspaces 121a, 121b, 121c and 121d are isolated from each other by a partition wall. The bottom surface of each of the four subspaces 121a, 121b, 121c and 121d is formed with the plurality of jet openings 22. As in the first preferred embodiment, each of the jet openings 22 is an cylindrical hole having a diameter ranging from 0.5 mm to 1.5 mm, and is formed through a lower wall surface of the cooling box 120 and the reflector 52 so that the axis of the cylindrical hole extends in a vertical direction. Each of the jet openings 22 has an upper end open to communicate with the buffer space 121, and has a lower end open toward the light source including the plurality of flash lamps 69. In other words, the jet openings 22 are provided so as to extend from the buffer space 121 toward the light source.

As shown in FIG. 10, four gas supply ports 123a, 123b, 123c and 123d are provided on an outer side wall of the cooling box 120. The four gas supply ports 123a, 123b, 123c and 123d are in communication with the subspaces 121a, 121b, 121c and 121d, respectively. The gas supply mechanism 30 supplies a predetermined gas (in this preferred embodiment, nitrogen gas) into the buffer space 121 of the cooling box 120. The gas supply mechanism 30 of the second preferred embodiment is exactly identical in construction with that of the first preferred embodiment, and components of the gas supply mechanisms 30 of the second preferred embodiment are designated by the same reference numerals and characters as in FIG. 6. Specifically, the gas supply mechanism 30 supplies the nitrogen gas from the nitrogen gas supply source 99 through the gas pipe 37 into the buffer space 121. The four branch pipes 37a, 37b, 37c and 37d into which the gas pipe 37 is divided are connected to the gas supply ports 123a, 123b, 123c and 123d, respectively. Thus, the gas supply mechanism 30 supplies the nitrogen gas individually to the four subspaces 121a, 121b, 121c and 121d. Each of the needle valves 35a, 35b, 35c and 35d adjusts the flow rate, based on a set value, to thereby accomplish the individual adjustment of the flow rates of nitrogen gas supplied from the gas supply mechanism 30 to the four subspaces 121a, 121b, 121c and 121d.

The nitrogen gas supplied through the four branch pipes 37a, 37b, 37c and 37d flows into the subspaces 121a, 121b, 121c and 121d, respectively. At this time, the nitrogen gas fed from the branch pipe 37a through the gas supply port 123a impinges once on a buffer plate 125a to decrease in gas flow velocity, thereby flowing into the subspace 121a uniformly. The buffer plate 125a is equal in height to the partition wall for partitioning the buffer space 121. The nitrogen gas fed from the branch pipe 37b through the gas supply port 123b impinges once on a buffer plate 125b to decrease in gas flow velocity, thereby flowing into the subspace 121b uniformly. The buffer plate 125b is constructed as part of the partition wall for partitioning the buffer space 121. Similarly, the nitrogen gas fed from the branch pipe 37c through the gas supply port 123c impinges once on a buffer plate 125c to decrease in gas flow velocity, thereby flowing into the subspace 121c uniformly. The buffer plate 125c is equal in height to the partition wall for partitioning the buffer space 121.

On the other hand, the nitrogen gas fed from the branch pipe 37d through the gas supply port 123d flows through a flow passage space 125d, passes over a buffer wall 125e, and then flows into the subspace 121d. The height of the buffer wall 125e is less than that of the partition wall for partitioning the buffer space 121. The flow of nitrogen gas passes over the buffer wall 125e to thereby flow into the subspace 121d uniformly. It should be noted that the flow passage space 125d is not a component of the buffer space 121.

The nitrogen gas supplied into the subspaces 121a, 121b, 121c and 121d in this manner is temporarily stored therein, and is then ejected from the jet openings 22 formed in each of the subspaces 121a, 121b, 121c and 121d toward the light source. The pressure of the nitrogen gas in the buffer space 121 at this time is slightly greater than atmospheric pressure.

Figure 12:
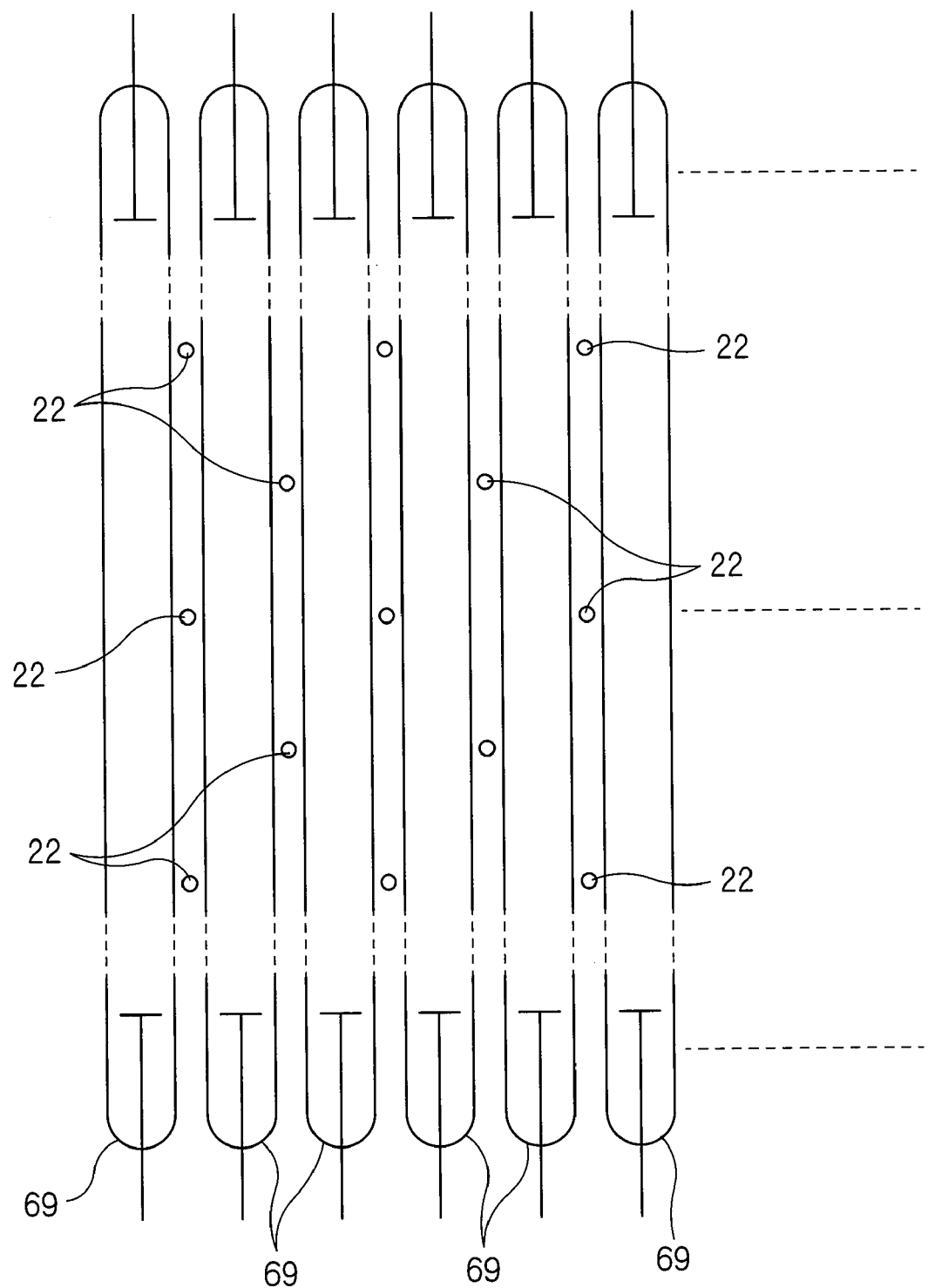
FIG. 12 is a plan view showing the arrangement of jet openings according to the second preferred embodiment.

FIG. 12 is a plan view showing the arrangement of the jet openings 22 according to the second preferred embodiment. The plurality of jet openings 22 according to the second preferred embodiment are arranged in the form of a triangular-lattice in the bottom surface of each of the subspaces of the cooling box 120, and are positioned just over gaps between the plurality of flash lamps 69 in the lamp array. Thus, the nitrogen gas supplied into the subspaces 121a, 121b, 121c and 121d is ejected from the plurality of jet openings 22 toward the gaps between adjacent ones of the flash lamps 69, as in the first preferred embodiment (See FIG. 8). The ejected nitrogen gas passes through the gaps between adjacent ones of the flash lamps 69 without being obstructed by the flash lamps 69. The nitrogen gas ejected from the jet openings 22 and passing through the gaps between adjacent ones of the flash lamps 69 is then blown against the lamp light radiation window 53.

As illustrated in FIG. 11, the cooling box 120 according to the second preferred embodiment is formed with the jet openings 22 arranged asymmetrically. As discussed above, a temperature gradient such that the temperature increases in a direction from the suction inlet 55 toward the exhaust outlet 56 (or the temperature increases in a direction indicated by the arrow AR11) is created across the lamp light radiation window 53 because of the gas flow produced by the suction inlet 55 and the exhaust outlet 56. The number of jet openings 22 disposed in a portion of the cooling box 120 closer to the exhaust outlet 56 (or a region of the cooling box 120 opposed to a relatively high temperature region of the lamp light radiation window 53) is greater than the number of jet openings 22 disposed in a portion of the cooling box 120 closer to the suction inlet 55 (or a region of the cooling box 120 opposed to a relatively low temperature region of the lamp light radiation window 53). Thus, more nitrogen gas flows are blown against the relatively high temperature region of the lamp light radiation window 53 than against the relatively low temperature region thereof. The jet openings 22 are arranged at a uniform density throughout the cooling box 120, and the four subspaces 121a, 121b, 121c and 121d are approximately equal in the number of jet openings 22. Thus, the supply of nitrogen gas at an equal flow rate into the subspaces 121a, 121b, 121c and 121d provides an approximately equal flow rate of nitrogen gas ejected from the individual jet openings 22 formed in the cooling box 120 without making a distinction between the subspaces 121a, 121b, 121c and 121d.

The flow rates of nitrogen gas supplied to the four subspaces 121a, 121b, 121c and 121d are individually adjustable also in the second preferred embodiment. The flow rates of nitrogen gas ejected from the jet openings 22 in the subspaces are accordingly adjusted on a subspace-by-subspace basis. As a result, the flow rate of nitrogen gas blown against the lamp light radiation window 53 varies depending on regions lying over the lamp light radiation window 53.

The heat treatment apparatus 1a according to the second preferred embodiment is similar in construction except the foregoing to the heat treatment apparatus 1 according to the first preferred embodiment. The procedure for the treatment of the semiconductor wafer W in the heat treatment apparatus 1a according to the second preferred embodiment is also similar to that according to the first preferred embodiment.

The heat treatment apparatus 1a according to the second preferred embodiment is also adapted to eject the nitrogen gas from the jet openings 22 of the cooling box 120 toward the light source. The nitrogen gas ejected from the jet openings 22 passes through the gaps between adjacent ones of the flash lamps 69 in the lamp array, and is then blown against the lamp light radiation window 53. The ejected nitrogen gas makes a heat exchange with the discharge tubes to cool down the flash lamps 69 when passing through the gaps between adjacent ones of the flash lamps 69. The ejected nitrogen gas further makes a heat exchange by being blown against the lamp light radiation window 53, to cool down the lamp light radiation window 53.

In this manner, the plurality of flash lamps 69 constituting the light source are cooled down directly by the nitrogen gas ejected from the cooling box 120, as in the first preferred embodiment. Additionally, the lamp light radiation window 53 is cooled down to a lowered temperature, whereby the temperature rise due to the radiation from the lamp light radiation window 53 is suppressed. As a result, both the direct cooling using the nitrogen gas and the decrease in temperature of the lamp light radiation window 53 accomplish the effective cooling of the plurality of flash lamps 69. The effective cooling of the flash lamps 69 not only prevents the deterioration of the flash lamps 69 to increase the lifetime of the flash lamps 69 but also allows a high setting of the preheating temperature of the semiconductor wafer W by the hot plate 71, thereby achieving wide treating conditions of the annealing process of the semiconductor wafer W.

In the second preferred embodiment, the one-sided exhausting of the gas through the exhaust outlet 56 provided only on one side of the cooling box 120 creates a temperature gradient across the lamp light radiation window 53 such that the temperature increases in a direction from the suction inlet 55 toward the exhaust outlet 56. In corresponding relation to the temperature gradient, the cooling box 120 is formed with the plurality of jet openings 22 arranged asymmetrically so that the number of jet openings 22 in the region of the cooling box 120 opposed to the relatively high temperature region of the lamp light radiation window 53 is greater than the number of jet openings 22 in the region of the cooling box 120 opposed to the relatively low temperature region of the lamp light radiation window 53. Thus, more nitrogen gas flows are blown against the relatively high temperature region of the lamp light radiation window 53 than against the relatively low temperature region thereof. The relatively high temperature region is cooled down more intensively. In other words, the jet openings 22 are arranged asymmetrically in the cooling box 120 so as to reduce the nonuniformity of the temperature distribution across the lamp light radiation window 53 resulting from the one-sided exhausting of the gas through the exhaust outlet 56, whereby the flow rate of the nitrogen gas ejected is adjusted. As a result, the good uniformity of the temperature distribution across the lamp light radiation window 53 provides good uniformity of the temperature distribution across the chamber window 61 disposed in opposed relation to the lamp light radiation window 53, and further improves the uniformity of an in-plane temperature distribution across the semiconductor wafer W held in opposed relation to and in close proximity to the chamber window 61 by the holding part 7.

If the supply of nitrogen gas at an equal flow rate into the four subspaces 121a, 121b, 121c and 121d does not sufficiently eliminate the nonuniformity of the temperature distribution across the lamp light radiation window 53, the needle valves 35a, 35b, 35c and 35d may be used to individually adjust the flow rates of nitrogen gas supplied to the four subspaces 121a, 121b, 121c and 121d, respectively, thereby easily eliminating the nonuniformity of the temperature distribution occurring across the lamp light radiation window 53. As an example, if the temperature of the second portion of the lamp light radiation window 53 closer to the exhaust outlet 56 is still high, the adjustment is made so that the nitrogen gas is supplied at a higher flow rate to the subspace 121a of the cooling box 120 closer to the exhaust outlet 56. This increases the flow rate of nitrogen gas blown against the second portion of the lamp light radiation window 53 closer to the exhaust outlet 56 to decrease the temperature of the second portion of the lamp light radiation window 53, thereby eliminating the nonuniformity of the temperature distribution across the lamp light radiation window 53. As a result, this improves the in-plane temperature distribution across the semiconductor wafer W held by the holding part 7. That is, the individual adjustment of the flow rates of nitrogen gas supplied to the four subspaces 121a, 121b, 121c and 121d may be made using the needle valves 35a, 35b, 35c and 35d so as to reduce the nonuniformity of the temperature distribution across the lamp light radiation window 53 resulting from the one-sided exhausting of the gas through the exhaust outlet 56.

The first preferred embodiment provides the uniform temperature distribution across the lamp light radiation window 53 more easily because of the capability of making the gas flows produced within the lamp house 5 symmetric with respect to the central axis. The first preferred embodiment also accomplishes more effective cooling of the flash lamps 69 and the lamp light radiation window 53 by the use of the high flow rate of nitrogen gas because of the arrangement of the jet openings 22 in the form of a square-lattice. The first preferred embodiment, however, is required to supply all of the gas for cooling the lamp house 5 through the cooling box 20, resulting in the consumption of a large amount of nitrogen gas for cooling. The second preferred embodiment, on the other hand, finds slight difficulty in adjusting the flow rates of nitrogen gas supplied to the respective subspaces so as to make the temperature distribution across the lamp light radiation window 53 uniform. However, the second preferred embodiment requires a small amount of nitrogen gas supplied through the cooling box 120 because of the capability of introducing the cooling gas also through the suction inlet 55. It is hence preferred to implement the first preferred embodiment when a utility system in a factory in which the heat treatment apparatus is installed can provide a large amount of cooling gas, and to implement the second preferred embodiment when the utility system can provide only a small amount of cooling gas.

3. Modifications

Although the preferred embodiments according to the present invention have been described hereinabove, various modifications in addition to the above may be made therein without departing from the spirit and scope of the present invention. For example, the plurality of jet openings 22 according to the first preferred embodiment may be arranged in the form of a triangular-lattice, and the plurality of jet openings 22 according to the second preferred embodiment may be arranged in the form of a square-lattice. The arrangement of the plurality of jet openings 22 in the form of a square-lattice allows the ejection of a greater amount of nitrogen gas. This provides an increased contact area between the nitrogen gas and the discharge tubes of the flash lamps 69 to improve a cooling effect. On the other hand, the arrangement of the plurality of jet openings 22 in the form of a triangular-lattice allows the reduction in the total number of jet openings 22. This suppresses the increase in the consumption of the nitrogen gas.

The cooling gas ejected from the cooling boxes 20 and 120 is the nitrogen gas in the preferred embodiments described above. The type of gas used herein, however, is not limited to the nitrogen gas, but may be a gas having a cooling function. As an example, air may be used as the cooling gas. Since the cooling gas is consumed in large amounts, inexpensive air or nitrogen gas is preferably used as the cooling gas from the viewpoint of suppressing the increase in costs.

Each of the cooling boxes 20 and 120 is divided into four compartments in the preferred embodiments described above. However, the number of compartments into which the cooling box is divided is not limited to four, but may be any number equal to or greater than two.

Although the 30 flash lamps 69 are provided in the lamp house 5 according to the preferred embodiments described above, the present invention is not limited to this. Any number of flash lamps 69 may be provided. The flash lamps 69 are not limited to the xenon flash lamps but may be krypton flash lamps.

The preferred embodiments described above suppress the thermal effect of the chamber window 61 to suppress the accumulation of heat in the flash lamps 69 by blowing the nitrogen gas against the lamp light radiation window 53 of the lamp house 5. In an instance where the lamp house 5 and the chamber 6 are provided integrally and a single common quartz member serving as both the lamp light radiation window and the chamber window is used as a radiation window, the use of the nitrogen gas blown through the gaps between the flash lamps 69 against the radiation window suppresses the temperature rise of the radiation window, to thereby suppress the accumulation of heat in the flash lamps 69, as in the preferred embodiments described above.

In the preferred embodiments described above, the ion activation process is performed by exposing the semiconductor wafer to light. The substrate to be treated by the heat treatment apparatus according to the present invention is not limited to the semiconductor wafer. For example, the heat treatment apparatus according to the present invention may perform the treatment on a glass substrate formed with various silicon films including a silicon nitride film, a polycrystalline silicon film and the like. As an example, silicon ions are implanted into a polycrystalline silicon film formed on a glass substrate by a CVD process to form an amorphous silicon film, and a silicon oxide film serving as an anti-reflection film is formed on the amorphous silicon film. In this state, the heat treatment apparatus according to the present invention may expose the entire surface of the amorphous silicon film to light to polycrystallize the amorphous silicon film, thereby forming a polycrystalline silicon film.

Another modification may be made in a manner to be described below. A TFT substrate is prepared such that an underlying silicon oxide film and a polysilicon film produced by crystallizing amorphous silicon are formed on a glass substrate and the polysilicon film is doped with impurities such as phosphorus or boron. The heat treatment apparatus according to the present invention may expose the TFT substrate to light to activate the impurities implanted in the doping step.

While the invention has been described in detail, the foregoing description is in all aspects illustrative and not restrictive. It is understood that numerous other modifications and variations can be devised without departing from the scope of the invention.

What is claimed is:

1. A heat treatment apparatus for exposing a substrate to a flash of light to heat the substrate, comprising:
   a chamber configured for receiving a substrate therein, said chamber including
      a holding part configured for holding the substrate, said holding part including a preheating mechanism configured for preheating the substrate held by said holding part before the substrate is exposed to a flash of light, and
      a chamber window configured for allowing a flash of light to pass therethrough into said holding part; and
   a lamp house configured for emitting a flash of light, said lamp house including
      a light source including a plurality of flash lamps arranged in an array and each having a rodlike discharge tube configured for directing a flash of light from the discharge tubes toward the substrate held by said holding part within said chamber,
      a radiation window provided in opposed relation to said chamber window configured for allowing a flash of light emitted from said light source to pass therethrough toward said chamber, and
      a gas ejection part configured for causing a gas to pass through gaps between said plurality of flash lamps arranged in the array and to be blown against said radiation window; wherein said gas ejection part includes:
         a buffer space divided into a plurality of compartments, and
         a plurality of jet openings extending through wall surfaces of said plurality of compartments toward the gaps between said plurality of flash lamps,
   said heat treatment apparatus further comprising:
      a gas supply element configured for individually supplying a gas to said plurality of compartments of said buffer space; and
      a flow rate adjustment element configured for individually adjusting the flow rate of the gas supplied from said gas supply element to each of said plurality of compartments.

2. The heat treatment apparatus according to claim 1, wherein
   said lamp house includes
   a plurality of exhaust elements disposed symmetrically with respect to said gas ejection part for exhausting the gas blown from said gas ejection part against said radiation window to the outside.

3. The heat treatment apparatus according to claim 1, wherein
   said lamp house includes
   an exhaust element disposed only on one side of said gas ejection part for exhausting the gas blown from said gas ejection part against said radiation window to the outside, and the number of jet openings disposed on said one side of said gas ejection part is greater than the number of jet openings disposed on the other side of said gas ejection part opposite from said one side.

4. The heat treatment apparatus according to claim 1, wherein said lamp house includes an exhaust element disposed only on one side of said gas ejection part for exhausting the gas blown from said gas ejection part against said radiation window to the outside, and said flow rate adjustment element adjusts the flow rate of the gas supplied to each of said plurality of compartments so as to reduce nonuniformity of a temperature distribution across said radiation window resulting from the exhausting of the gas by said exhaust element.

5. The heat treatment apparatus according to claim 1, wherein said plurality of compartments are arranged symmetrically with respect to a central axis of said gas ejection part.

6. The heat treatment apparatus according to claim 1, wherein said plurality of jet openings are arranged in the form of a square-lattice.

7. The heat treatment apparatus according to claim 1, wherein said plurality of jet openings are arranged in the form of a triangular-lattice.

* * * * *